(12) United States Patent
Kim et al.

(10) Patent No.: US 10,937,508 B2
(45) Date of Patent: Mar. 2, 2021

(54) NONVOLATILE MEMORY DEVICES AND METHODS OF OPERATING A NONVOLATILE MEMORY

(71) Applicant: Samsung Electronics Co., Ltd., Suwon-si (KR)

(72) Inventors: Seung-Bum Kim, Hwaseong-si (KR); Il-Han Park, Suwon-si (KR); Ji-Young Lee, Suwon-si (KR); Su-Chang Jeon, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/364,588

(22) Filed: Mar. 26, 2019

(65) Prior Publication Data

US 2020/0098436 A1   Mar. 26, 2020

(30) Foreign Application Priority Data

Sep. 21, 2018   (KR) .......................... 10-2018-0113427

(51) Int. Cl.
*G11C 16/26*      (2006.01)
*G11C 11/56*      (2006.01)
(Continued)

(52) U.S. Cl.
CPC .......... *G11C 16/26* (2013.01); *G06F 11/1068* (2013.01); *G11C 11/5642* (2013.01);
(Continued)

(58) Field of Classification Search
CPC . G11C 16/26; G11C 11/5642; G11C 11/5671; G11C 16/24; G11C 16/10;
(Continued)

(56) References Cited

U.S. PATENT DOCUMENTS 8,099,652 B1   1/2012  Alrod et al.
9,036,417 B2   5/2015  Chen et al.
(Continued)

FOREIGN PATENT DOCUMENTS

KR   10-2017-0058066 A   5/2017
KR   10-2017-0086173 A   7/2017

*Primary Examiner* — Jay W. Radke
(74) *Attorney, Agent, or Firm* — Harness, Dickey & Pierce, P.L.C.

(57) ABSTRACT

Nonvolatile memory device includes a memory cell array including pages, each of the pages including memory cells storing data bits, each of the data bits being selectable by a different threshold voltage, a page buffer circuit coupled to the memory cell array through bit-lines, the page buffer circuit including page buffers to sense data from selected memory cells, and perform a first read operation and a second read operation, each including two sequential sensing operations to determine one data state, and each of the page buffers including a latch configured to sequentially store results of the two sequential sensing operations, and a control circuit to control the page buffers to store a result of the first read operation, reset the latches after completion of the first read operation, and perform the second read operation based on a valley determined based on the result of the first read operation.

20 Claims, 25 Drawing Sheets

(51) Int. Cl.
  *G11C 16/24* (2006.01)
  *G11C 16/10* (2006.01)
  *G11C 16/34* (2006.01)
  *G06F 11/10* (2006.01)
  *G11C 29/52* (2006.01)
  *G11C 16/14* (2006.01)
  *G11C 16/04* (2006.01)

(52) U.S. Cl.
  CPC .......... *G11C 11/5671* (2013.01); *G11C 16/10* (2013.01); *G11C 16/14* (2013.01); *G11C 16/24* (2013.01); *G11C 16/3445* (2013.01); *G11C 16/3459* (2013.01); *G11C 29/52* (2013.01); *G11C 11/5628* (2013.01); *G11C 11/5635* (2013.01); *G11C 16/0483* (2013.01)

(58) Field of Classification Search
  CPC . G11C 16/3459; G11C 16/3445; G11C 29/52; G11C 16/14; G11C 11/5635; G11C 16/0483; G11C 11/5628; G11C 2029/0409; G11C 2029/0411; G11C 16/30; G11C 16/08; G06F 11/1068; G06F 11/1048; G06F 12/0246; G06F 12/0882
  See application file for complete search history.

(56) References Cited

U.S. PATENT DOCUMENTS

| | | |
|---|---|---|
| 9,117,536 B2 | 8/2015 | Yoon et al. |
| 9,558,816 B2 | 1/2017 | Han et al. |
| 9,741,402 B2 | 8/2017 | Jeon |
| 9,991,007 B2 | 6/2018 | Lee et al. |
| 2016/0124805 A1 | 5/2016 | Lee |
| 2017/0133087 A1 | 5/2017 | Park et al. |
| 2018/0204624 A1* | 7/2018 | Yoon ...................... G11C 16/28 |

\* cited by examiner

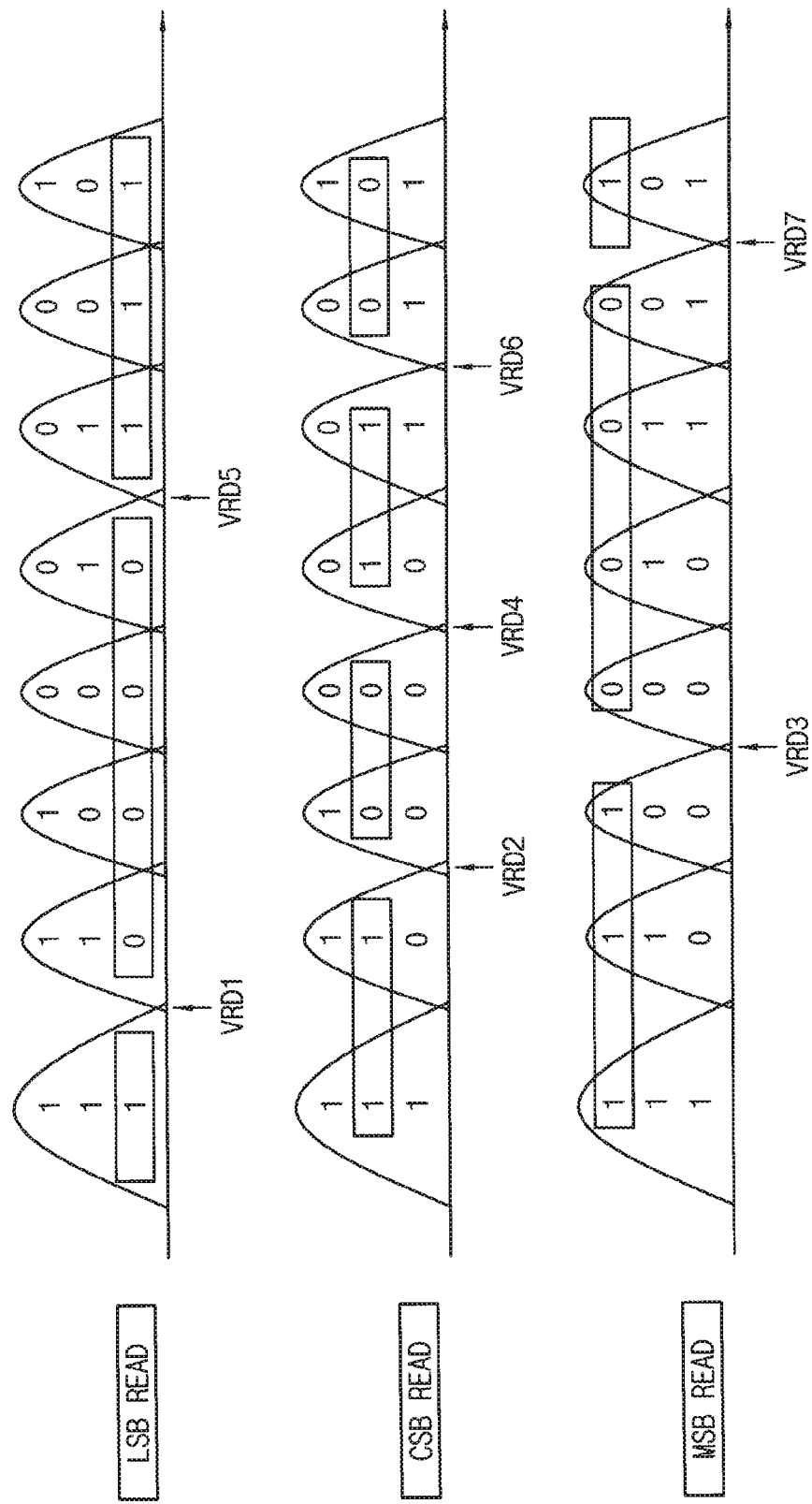

NONVOLATILE MEMORY DEVICES AND METHODS OF OPERATING A NONVOLATILE MEMORY

CROSS-REFERENCE TO RELATED APPLICATION

This US application claims priority under 35 USC § 119 to Korean Patent Application No. 10-2018-0113427, filed on Sep. 21, 2018, in the Korean Intellectual Property Office (KIPO), the disclosure of which is incorporated in its entirety by reference herein.

BACKGROUND

1. Technical Field

Example embodiments relate generally to semiconductor memory devices, and more particularly to nonvolatile memory devices and methods of operating nonvolatile memory devices.

2. Discussion of the Related Art

A semiconductor memory device is a storage device which is fabricated with semiconductors such as, but not limited to, silicon (Si), germanium (Ge), gallium arsenide (GaAs), and indium phosphide (InP). Semiconductor memory devices are classified as volatile memory or non-volatile memory depending on data retention characteristics of the memory devices upon being cut off from a power supply.

The volatile memory loses contents stored therein when cut off from the power supply. Examples of volatile memory include the following: a static RAM (SRAM), a dynamic RAM (DRAM), and a synchronous DRAM (SDRAM). The nonvolatile memory retains stored contents even when cut off from the power supply. Examples of nonvolatile memory include the following: a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), and a ferroelectric RAM (FRAM).

The flash memory has the following advantages: mass storage capability, relatively high noise immunity, and low power operation. To increase storage capacity, the flash memory may be formed of a multi-level cell which stores two or more bits of data per cell. Where at least two or more data bits are stored in one memory cell, the number of program states used to accommodate the data bits may be increased. Therefore, the read margin between two adjacent program states may be reduced. The flash memory having such reduced read margin may be vulnerable to read failure during a read operation.

In addition, data read from memory cells includes error bits due to physical factors such as program disturbance and read disturbance generated by adjacent memory cells due to fabrication scaling. Such error bits may be corrected using error correcting methods.

SUMMARY

Some example embodiments are directed to provide methods of operating a nonvolatile memory device to enhance performance and data reliability.

According to example embodiments, a nonvolatile memory device includes a memory cell array including a plurality of pages, each of the plurality of pages including a plurality of memory cells, each of the plurality of memory cells storing a plurality of data bits, each of the plurality of data bits being selectable by a different threshold voltage. The nonvolatile memory device also includes a page buffer circuit coupled to the memory cell array through a plurality of bit-lines, the page buffer circuit including a plurality of page buffers configured to sense data from selected memory cells among the plurality of memory cells through the plurality of bit-lines, and perform a first read operation and a second read operation, each including two sequential sensing operations to determine one data state, and each of the plurality of page buffers including a latch, among a plurality of latches, configured to sequentially store results of the two sequential sensing operations. The nonvolatile memory device also includes a control circuit configured to control the plurality of page buffers to store a result of the first read operation, reset the plurality of latches after completion of the first read operation, and control the plurality of page buffers to perform the second read operation based on a valley determined based on the result of the first read operation.

According to example embodiments, a method of operating a nonvolatile memory device including a memory cell array, the memory cell array including a plurality of pages, each of the plurality of pages including a plurality of memory cells, each of the plurality of memory cells storing a plurality of data bits, each of the plurality of data bits being selectable by a different threshold voltage. The method includes performing a first read operation including two sensing operations to determine one data state from one or more selected memory cells among the plurality of memory cells through a plurality of bit-lines, and performing a second read operation to determine one data state based on a valley determined based on a result of the first read operation, wherein results of the two sensing operations are sequentially stored in a plurality of latches, each latch among the plurality of latches being included in a corresponding page buffer among a plurality of page buffers, the plurality of page buffers being coupled to the plurality of bit-lines.

According to example embodiments, a method of operating a nonvolatile memory device including a memory cell array, the memory cell array including a plurality of pages, each of the plurality of pages including a plurality of nonvolatile memory cells, each of the plurality of nonvolatile memory cells storing a plurality of data bits, each of the plurality of data bits being selectable by a plurality of different threshold voltage. The method includes determining, in a control circuit of the nonvolatile memory device, a read setting of the nonvolatile memory device based on a command and an address, the command and the address being received from a memory controller configured to control the nonvolatile memory device, sensing one or more data bits stored in one or more selected memory cells among the plurality of nonvolatile memory cells based on a normal read condition in response to determining the read setting designates a normal read operation, and performing an on-chip valley search read operation on the one or more selected memory cells in response to determining the read setting designates a valley search read operation, wherein the on-chip valley search read operation is performed by determining a valley of the plurality of different threshold voltages, and sensing the one or more data bits stored in the one or more selected memory cells based on the valley.

Accordingly, during the on-chip valley search operation, a first group of page buffers and a second group of page buffers sequentially sense the sensing nodes two times during develop periods which have different develop starting time points, searches a valley by counting on cells based on a result of the sensing, and performs the second read operation based on the searched valley. Accordingly, the nonvolatile memory device may reduce errors in read data and may enhance performance by on-chip.

BRIEF DESCRIPTION OF THE DRAWINGS

Illustrative, non-limiting example embodiments will be more clearly understood from the following detailed description in conjunction with the accompanying drawings.

FIG. 23 is a diagram illustrating a read operation on a memory cell.

DETAILED DESCRIPTION

Various example embodiments will be described more fully hereinafter with reference to the accompanying drawings, in which some example embodiments are shown.

Figure 1:
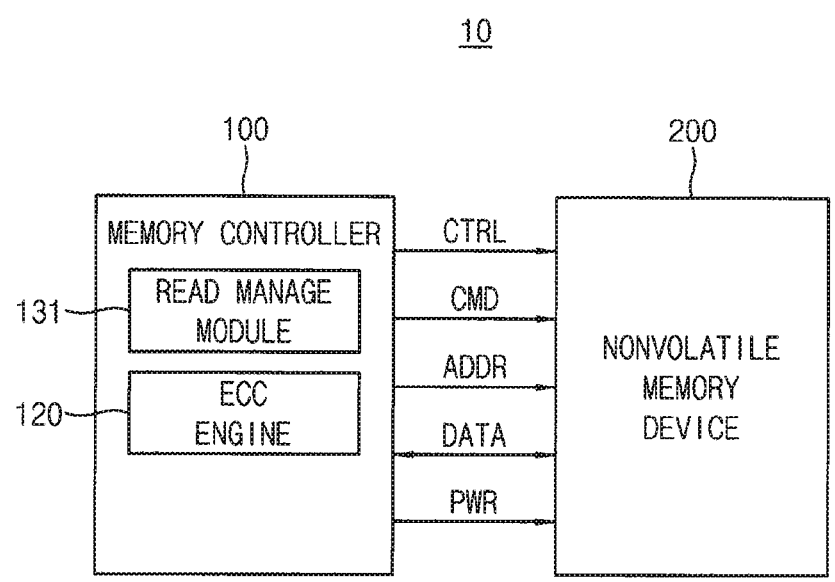
FIG. 1 is a block diagram illustrating a memory system (e.g., a storage device) according to example embodiments.

FIG. 1 is a block diagram illustrating a memory system 10 (e.g., a storage device) the according to example embodiments.

Referring to FIG. 1, a storage device (e.g., a memory system) 10 may include a memory controller 100 and at least one nonvolatile memory device 200.

In example embodiments, each of the memory controller 100 and the nonvolatile memory device 200 may be provided with the form of a chip, a package, and/or a module. Alternatively, the memory controller 100 and the nonvolatile memory device 200 may be packaged together into one of various packages. According to some example embodiments, the memory controller 100 and/or control elements of the nonvolatile memory device 200 may be implemented using processing circuitry. The term "processing circuitry," as used in the present disclosure, may refer to hardware and/or a combination hardware and software. For example, the processing circuitry may include a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner.

The nonvolatile memory device 200 may perform an erase operation, a program operation and/or a write operation under control of the memory controller 100. The nonvolatile memory device 200 may receive a command CMD, an address ADDR and/or data DATA through input/output lines from the memory controller 100 for performing such operations. In addition, the nonvolatile memory device 200 may receive a control signal CTRL through a control line from the memory controller 100. In addition, the nonvolatile memory device 200 may receive a power PWR through a power line from the memory controller 100.

Memory cells of the nonvolatile memory device 200 have different threshold voltages depending on the data states and the physical characteristics of the memory cells as the threshold voltages of the memory cells may be affected by a program elapsed time, a temperature, program disturbance, and/or read disturbance. Due to the reasons described above, data stored in the nonvolatile memory device 200 may become deteriorated and result in read data error. For correcting such data errors, the memory controller 100 may utilize a variety of error correction techniques. For example, the memory controller 100 includes an error correction code (ECC) engine 120 and a read manage module 131. According to some example embodiments, the ECC engine 120 and/or the read manage module 131 may be implemented using processing circuity.

During a read operation, the memory controller 100 may read data stored in a first page of the nonvolatile memory device 200, using a default read voltage set. The default read voltage set may include determined read voltages. The ECC engine 120 may detect and correct errors included in data read from the nonvolatile memory device 200. In example embodiments, the ECC engine 120 may be implemented in the form of hardware.

Data read in a read operation may include more error bits than the ECC engine 120 may correct. In this case, the ECC engine 120 fails to correct the errors of the data, which may be referred to as an 'uncorrectable error correction code (UECC) error'. Data having the UECC error may be referred to as 'UECC data'.

When the UECC error occurs, the read manage module 131 may adjust a read voltage set of the nonvolatile memory device 200. The memory controller 100 may resend the same address ADDR, command CMD, and/or control signal CTRL previously sent to the nonvolatile memory device 200, and thereby perform a read operation with the adjusted read voltage set. The adjusted read voltage set may be included in the control signal CTRL or the command CMD. The ECC engine 120 may reattempt detecting and correcting an error of the read data that is read with the adjusted read voltage set until the UECC error is corrected.

In example embodiments, the read manage module 131 may repeatedly adjust a read voltage set for a determined number of times, and the ECC engine 120 may repeatedly reattempt detecting and correcting an error of the data that is read using the adjusted read voltage set. For example, the memory controller 100 may repeat a set of operations the determined number of times including adjusting a read voltage set, reading data using the adjusted read voltage set, and correcting an error of the read data.

When an error of read data is corrected during iteration of the set of operations, the memory controller 100 may output corrected data to a host and stop iteration of the set of operations. When a read operation is iterated under a control of the read manage module 131, for example, read data or particular page data of the read data may be stored in a buffer 130 shown in FIG. 2. The buffer 130 may be a static random access memory (SRAM).

When an error of read data is not corrected after iteration of the set of operations (e.g., when the UECC error occurs), the memory controller 100 determines a starting voltage set for performing a valley search operation based on the data stored in the buffer 130.

When a read operation is performed on the first page in the memory cell array, the nonvolatile memory device 200 searches (e.g., determines) a valley by performing a first read operation including two sequential sensing operations and performs a second read operation based on the searched valley. Therefore, the nonvolatile memory device 200 may adjust a level of the read voltage according to a change of threshold voltage distributions without intervention of the memory controller 100.

The nonvolatile memory device 200, when a read operation on a first page selected from a memory cell array is performed, searches a valley by performing a first read operation including two sequential sensing operations and performs a second read operation based on the searched valley. Therefore, the nonvolatile memory device 200 may autonomously (internally) adjust a level of read voltage according to change of the threshold voltage distribution without intervention of the memory controller 100.

Figure 2:
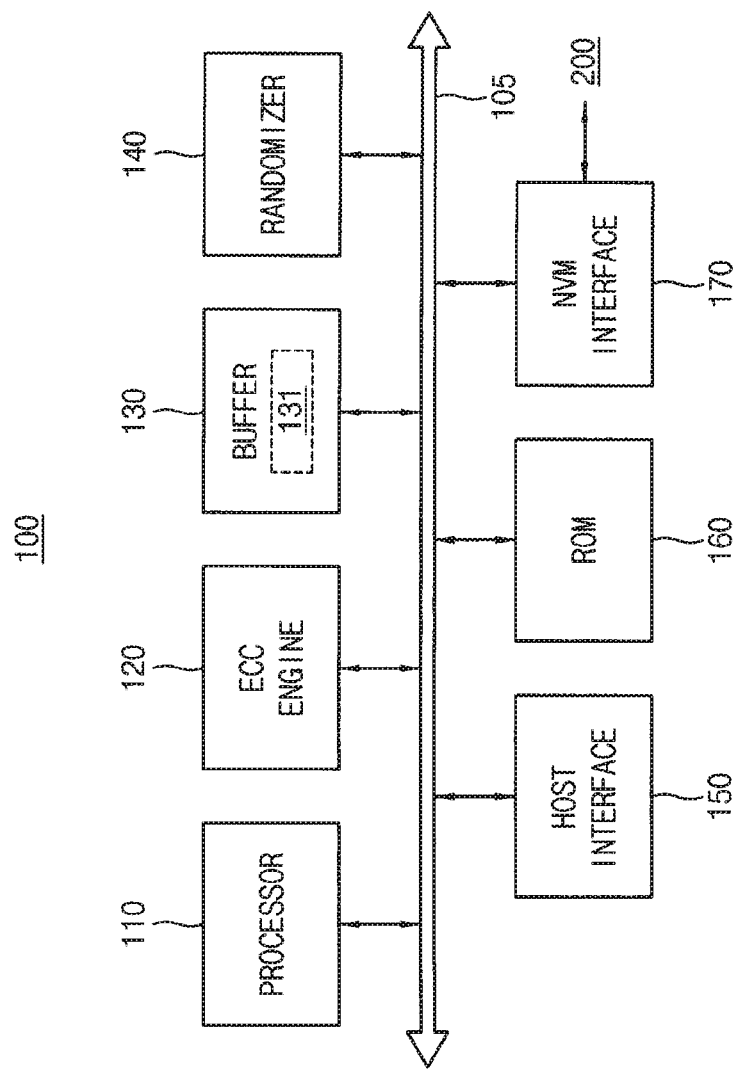
FIG. 2 is a block diagram illustrating the memory controller in the storage device of FIG. 1 according to example embodiments.

FIG. 2 is a block diagram illustrating the memory controller 100 in the storage device 10 of FIG. 1 according to example embodiments.

Referring to FIGS. 1 and 2, the memory controller 100 may include at least one processor 110 (also referred to herein as "the processor 110"), a ECC engine 120, a buffer 130, a read manage module 131, a randomizer 140, a host interface 150, a read only memory (ROM) 160 and a nonvolatile memory interface 170 which are connected via a bus 105. The ECC engine 120, the buffer 130 and the read manage module 131 performs the same or substantially the same functions as described above relating with FIG. 1.

The processor 110 may control an overall operation of the memory controller 100. In example embodiments, the read manage module 131 may be implemented in software and stored in the buffer 130. The read manage module 131 stored in the buffer 130 may be driven by the processor 110. The ROM 160 may store a variety of information, used by the memory controller 100 to operate, in firmware.

The randomizer 140 may randomize data to be stored in the nonvolatile memory device 200. For example, the randomizer 140 randomizes data to be stored in the nonvolatile memory device 200 on a word-line basis. According to some example embodiments, the randomizer 140 may be implemented using processing circuity.

Data randomizing is to process data to balance a ratio of different data states. For example, if memory cells connected to one word-line are multi-level cells (MLC) each storing 2-bit data, each of the memory cells has one of an erase state and first through third program states.

In this case, the randomizer 140 randomizes data of the memory cells connected to one word-line to balance the number of each data state of the memory cells. Thus, the number of memory cells having the erase state, the number of memory cells having the first program state, the number of memory cells having the second program state, and the number of memory cells having the third program state become substantially equal. The randomizer 140 de-randomizes data read from the nonvolatile memory device 200 to recover original data from the randomized data after reading out the data from the memory cells.

Alternatively, the randomizer 140 may randomize data on a page basis. For example, the randomizer 140 randomizes data for each state of the memory cells to be approximately equal in numbers. Thus, the number of memory cells programmed into one state is similar to the number of memory cells to programmed into other state, though the numbers may not be same.

The memory controller 100 may communicate with the host through the host interface 150. For example, the host interface 150 may include a Universal Serial Bus (USB), a Multimedia Card (MMC), an embedded-MMC, a peripheral component interconnection (PCI), a PCI-express, an Advanced Technology Attachment (ATA), a Serial-ATA, a Parallel-ATA, a small computer system interface (SCSI), an enhanced small disk interface (ESDI), an Integrated Drive Electronics (IDE), a Mobile Industry Processor Interface (MIPI), a Nonvolatile memory express (NVMe), a Universal Flash Storage (UFS), etc. The memory controller 100 may communicate with the nonvolatile memory device 200 through the nonvolatile memory interface 170 (e.g., as discussed in association with FIG. 1).

Figure 3:
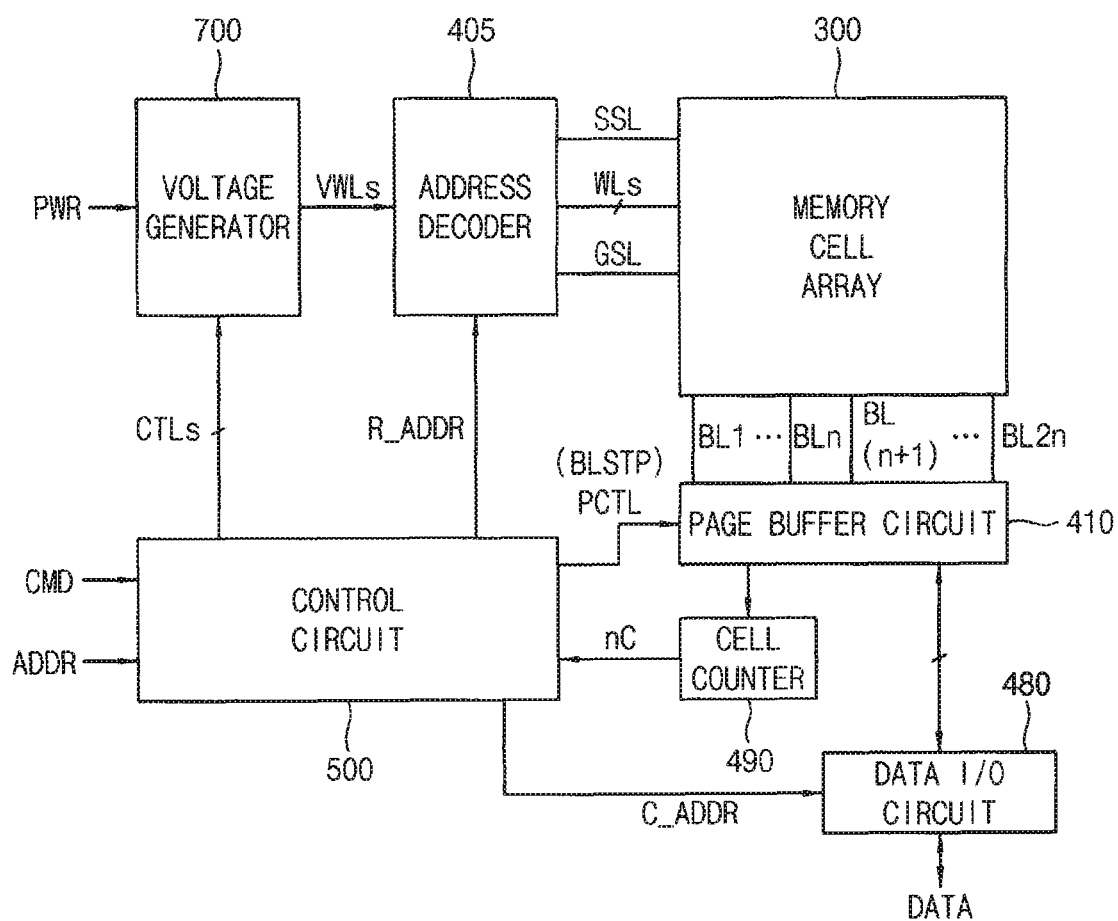
FIG. 3 is a block diagram illustrating the nonvolatile memory device in the memory system of FIG. 1 according to example embodiments.

FIG. 3 is a block diagram illustrating the nonvolatile memory device 200 in the memory system 10 of FIG. 1 according to example embodiments.

Referring to FIG. 3, the nonvolatile memory device 200 includes a memory cell array 300, an address decoder 405, a page buffer circuit 410, a data input/output circuit 480, a cell counter 490, a control circuit 500 and a voltage generator 700.

The memory cell array 300 may be coupled to the address decoder 405 through a string selection line SSL, a plurality of word-lines WLs, and a ground selection line GSL. In addition, the memory cell array 300 may be coupled to the page buffer circuit 410 through a plurality of bit-lines BLs. The memory cell array 300 may include a plurality of memory cells coupled to the plurality of word-lines WLs and the plurality of bit-lines BLs.

In some example embodiments, the memory cell array 300 may be a three-dimensional memory cell array, which is formed on a substrate in a three-dimensional structure (or a vertical structure). In this case, the memory cell array 300 may include vertical cell strings that are vertically oriented such that at least one memory cell is located over another memory cell. According to some example embodiments, the memory cell array 300 may be implemented as discussed in association with FIGS. 4-5; the page buffer circuit 410 may be implemented, as discussed in association with FIG. 11, to include a plurality of page buffers, such as those discussed in association with FIG. 7; the control circuit 500 may be implemented as discussed in association with FIGS. 8-9; and the voltage generator 700 may be implemented as discussed in association with FIG. 10. According to some example embodiments, the address decoder 405, the data input/output circuit 480, and/or the cell counter 490 may be implemented using processing circuity.

Figure 4:
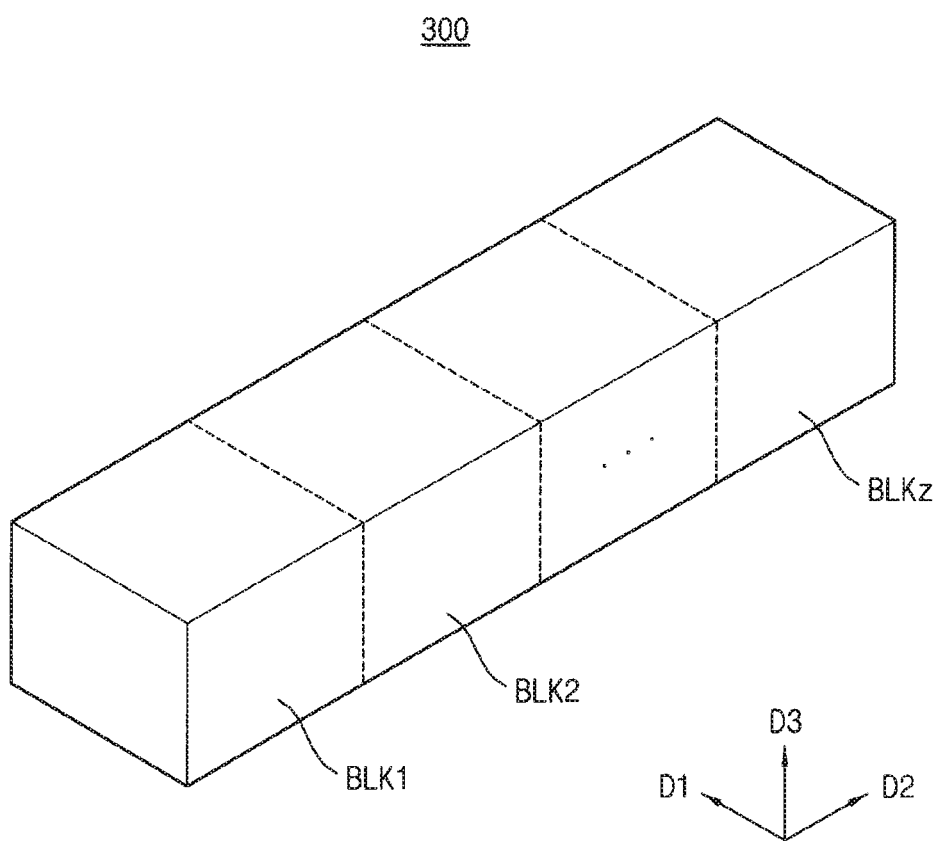
FIG. 4 is a block diagram illustrating the memory cell array in FIG. 3.

FIG. 4 is a block diagram illustrating the memory cell array 300 in FIG. 3.

Referring to FIG. 4, the memory cell array 300 may include a plurality of memory blocks BLK1 to BLKz which extend along first through third directions D1, D2 and D3. In some example embodiments, the memory blocks BLK1 to BLKz are selected by the address decoder 405 in FIG. 3. For example, the address decoder 405 may select a memory block BLK corresponding to a block address among the memory blocks BLK1 to BLKz.

Figure 5:
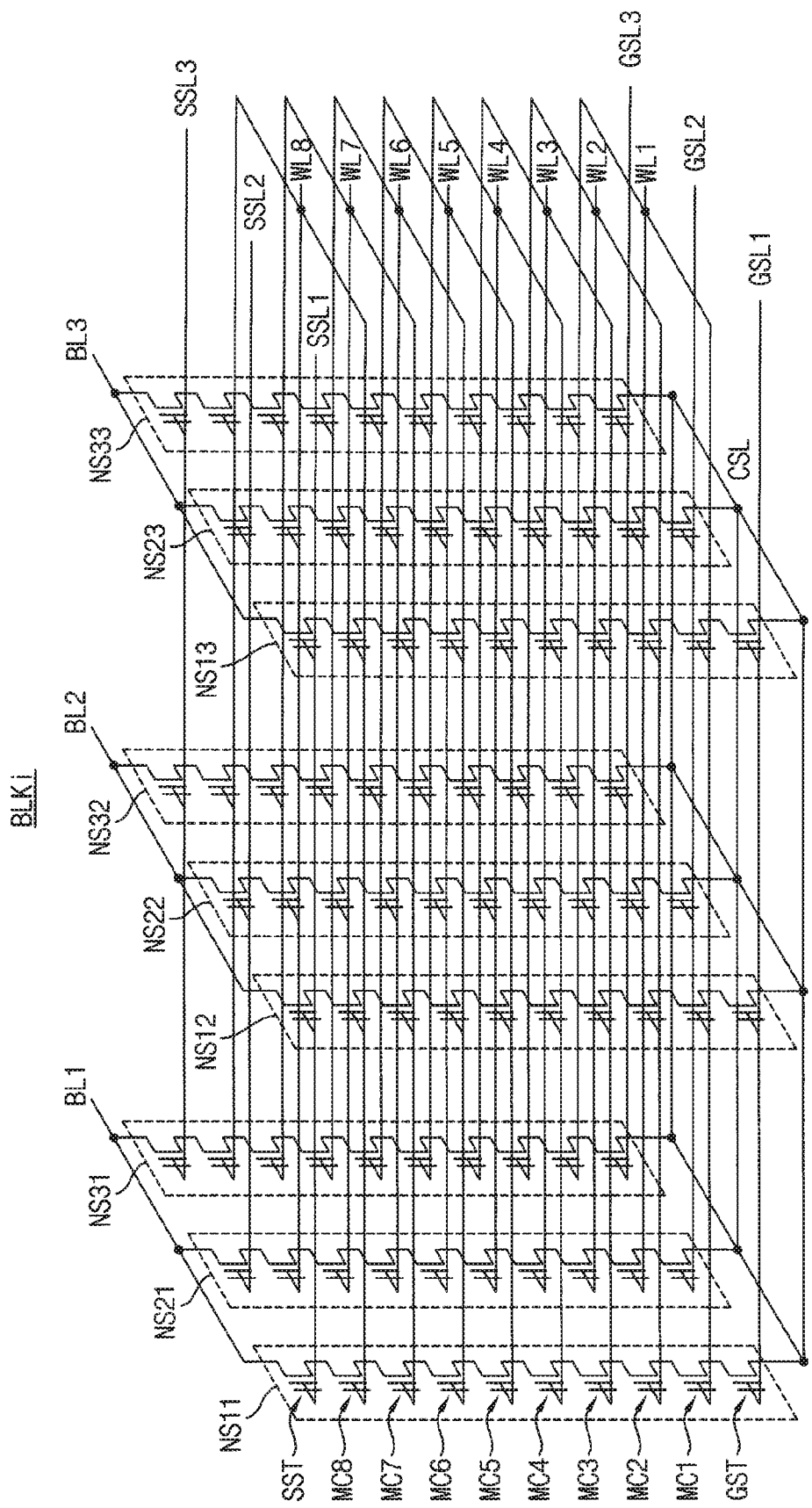
FIG. 5 is a circuit diagram illustrating one of the memory blocks in FIG. 4.

FIG. 5 is a circuit diagram illustrating one of the memory blocks in FIG. 4.

The memory block BLKi of FIG. 5 may be formed on a substrate in a three-dimensional structure (or a vertical structure). For example, a plurality of memory cell strings included in the memory block BLKi may be formed in a direction perpendicular to the substrate.

Referring to FIG. 5, a memory block BLKi may include memory cell strings NS11 to NS33 coupled between bit-lines BL1, BL2 and BL3 and a common source line CSL. Each of the memory cell strings NS11 to NS33 may include a string selection transistor SST, a plurality of memory cells MC1 to MC8, and a ground selection transistor GST. In FIG. 5, each of the memory cell strings NS11 to NS33 is illustrated to include eight memory cells MC1 to MC8. However, example embodiments are not limited thereto. In some example embodiments, each of the memory cell strings NS11 to NS33 may include any number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

Word-lines (e.g., WL1) having the same height may be commonly connected, and the ground selection lines GSL1 to GSL3 and the string selection lines SSL1 to SSL3 may be separated.

Referring back to FIG. 3, the control circuit 500 may receive a command (signal) CMD and an address (signal) ADDR from the memory controller 100 and control an erase loop, a program loop and/or a read operation of the non-volatile memory device 200 based on the command signal CMD and the address signal ADDR. The program loop may include a program operation and a program verification operation. The erase loop may include an erase operation and an erase verification operation.

For example, the control circuit 500 may generate control signals CTLs to control the voltage generator 700 and may generate a page buffer control signal PCTL to control the page buffer circuit 410 based on the command signal CMD. The control circuit 500 may generate a row address R_ADDR and a column address C_ADDR based on the address signal ADDR. The control circuit 500 may provide the row address R_ADDR to the address decoder 405 and provide the column address C_ADDR to the data input/output circuit 480.

The address decoder 405 may be coupled to the memory cell array 300 through the string selection line SSL, the plurality of word-lines WLs, and the ground selection line GSL. During the program operation and/or the read operation, the address decoder 405 may determine one of the plurality of word-lines WLs as a selected word-line and determine the rest of the plurality of word-lines WLs except for the selected word-line as unselected word-lines based on the row address R_ADDR.

The voltage generator 700 may generate word-line voltages VWLs, which are used for the operation of the non-volatile memory device 200, based on the control signals CTLs. The voltage generator 700 may receive the power PWR from the memory controller 100. The word-line voltages VWLs may be applied to the plurality of word-lines WLs through the address decoder 405.

For example, during the erase operation, the voltage generator 700 may apply an erase voltage to a well of the memory block and may apply a ground voltage to entire word-lines of the memory block. During the erase verification operation, the voltage generator 700 may apply an erase verification voltage to the entire word-lines of the memory block or sequentially apply the erase verification voltage to word-lines in a word-line basis.

For example, during the program operation, the voltage generator 700 may apply a program voltage to the selected word-line and may apply a program pass voltage to the unselected word-lines. In addition, during the program verification operation, the voltage generator 700 may apply a program verification voltage to the selected word-line and may apply a verification pass voltage to the unselected word-lines.

In addition, during the read operation, the voltage generator 700 may apply a default read voltage and an offset read voltage to the selected word-line and may apply a read pass voltage to the unselected word-lines.

The page buffer circuit 410 may be coupled to the memory cell array 300 through the plurality of bit-lines BLs. The page buffer circuit 410 may include a plurality of page buffers. In some example embodiments, one page buffer may be connected to one bit-line. In some example embodiments, one page buffer may be connected to two or more bit-lines.

The page buffer circuit 410 may temporarily store data to be programmed in a selected page or data read out from the selected page.

The page buffers may include a first group of page buffers coupled to a first group of bit-lines of the bit-lines BLs and a second group of page buffers coupled to a second group of bit-lines of the bit-lines BLs. The page buffer circuit 410 may temporarily store data to be programmed in a selected page in the program operation and may temporarily store data read from the selected page in the read operation.

Each of the first group of page buffers and the second group of page buffers may include at least one latch, and perform a first read operation and a second read operation to determine one data state. Each of the first read operation and the second read operation may include two sequential sensing operations. The first group of page buffers and the second group of page buffers may both perform sequential first and second sensing operations. That is, the first group of page buffers and the second group of page buffers may perform the first sensing operation substantially simultaneously (or contemporaneously) during respective develop periods which start from different time points, may perform the second sensing operation substantially simultaneously (or contemporaneously), and may provide the cell counter 490 with a result of the second sensing operation.

The cell counter 490 may count results of the second sensing operations which are provided from the first group of page buffers and the second group of page buffers and may provide the control circuit 500 with a number nC of memory cells which have a specific threshold voltage range.

The control circuit 500 may compare the number nC of memory cells, provided from the cell counter 490, may search a valley of the threshold voltage distributions based on a result of the comparison and may control the page buffer circuit 410 to perform the second read operation based on the searched valley.

The data input/output circuit 480 may be coupled to the page buffer circuit 410. During the program operation, the data input/output circuit 480 may receive program data DATA from the memory controller 100 and provide the program data DATA to the page buffer circuit 410 based on the column address C_ADDR received from the control circuit 500. During the read operation, the data input/output circuit 480 may provide read data DATA, which are stored in the page buffer circuit 410, to the memory controller 100 based on the column address C_ADDR received from the control circuit 500.

Figure 6:
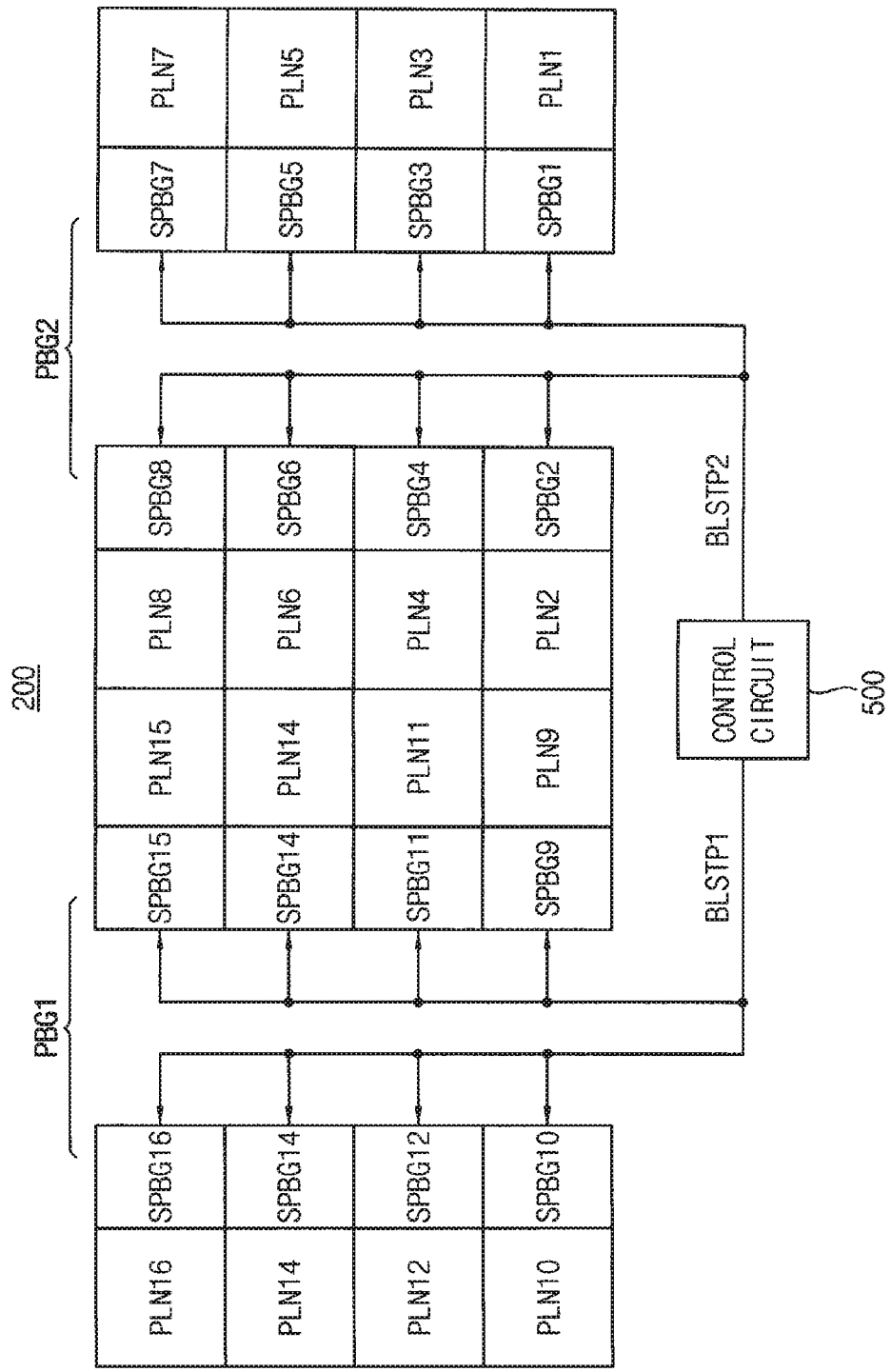
FIG. 6 illustrates a block diagram illustrating the nonvolatile memory device according to example embodiments.

FIG. 6 illustrates a block diagram illustrating the nonvolatile memory device 200 according to example embodiments.

While FIG. 3 is a block diagram illustrates various configurations connected to the nonvolatile memory device 200, FIG. 6 illustrates a connection relationship between a plurality of planes constituting the memory cell array 300 in FIG. 3, the page buffer circuit 410 and the control circuit 500. In FIG. 6, like reference numerals to those in FIG. 3 denote like elements, and therefore, repeated descriptions thereof will not be given herein.

Referring to FIGS. 3 and 6, the memory cell array 300 may include a plurality of planes PNL1~PLN16. The page buffer circuit 410 may include a plurality of sub page buffer groups SPBG1~SPBG16 corresponding to the plurality of planes PNL1~PLN16. Page buffers included in the sub page buffer groups SPBG9~SPBG16 may constitute a first group of page buffers PBG1 and page buffers included in the sub page buffer groups SPBG1~SPBG8 may constitute a second group of page buffers PBG2.

The control circuit 500 may apply a first bit-line set-up signal BLSTP1 to the first group of page buffers PBG1 such that the first group of page buffers PBG1 start bit-line develop at a first time point and may apply a second bit-line set-up signal BLSTP2 to the second group of page buffers PBG2 such that the second group of page buffers PBG2 start bit-line develop at a second time point posterior to the first time point.

Figure 7:
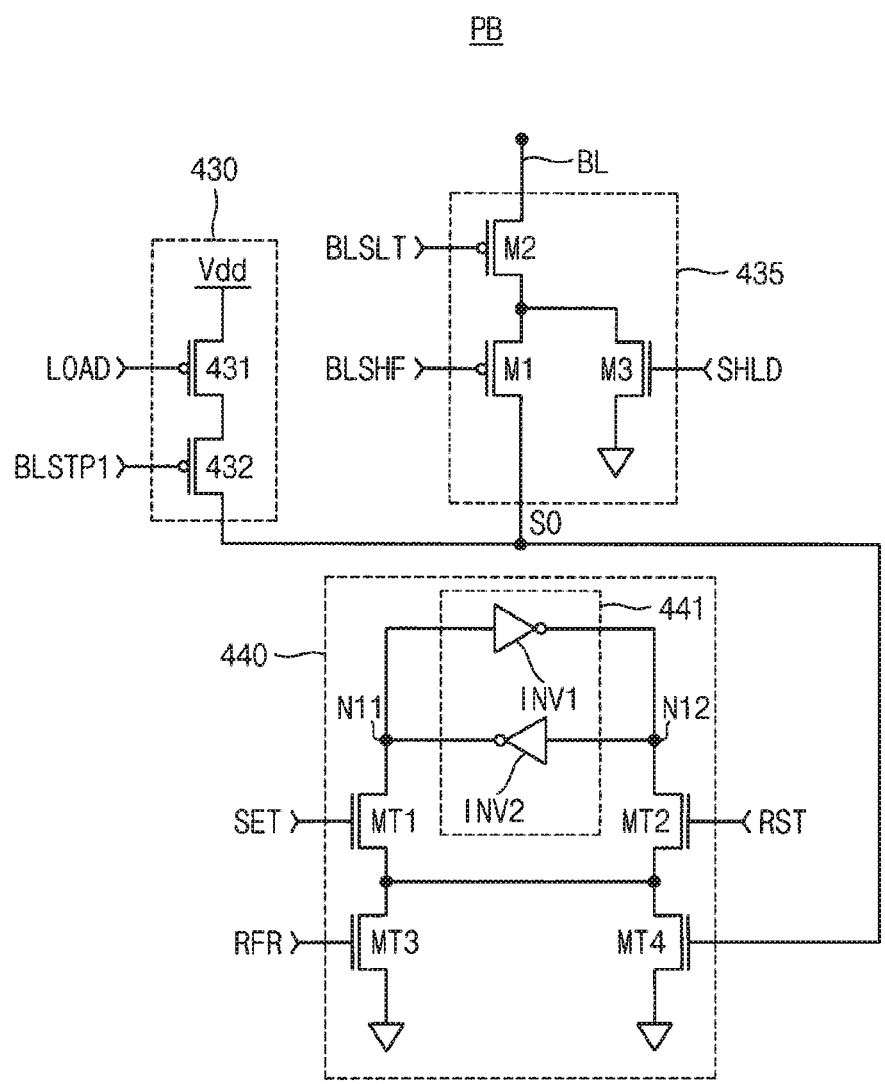
FIG. 7 is a circuit diagram illustrating one of page buffers in the page buffer circuit in FIG. 3 according to example embodiments.

FIG. 7 is a circuit diagram illustrating one of page buffers in the page buffer circuit 410 in FIG. 3 according to example embodiments.

Referring to FIG. 7, a page buffer PB includes a pre-charge circuit 430, a switch circuit 435 and a sense and latch circuit 440.

The pre-charge circuit 430, the switch circuit 435 and the sense and latch circuit 440 of the page buffer PB may operate responsive to the control signal PBC (also referred to herein as "PCTL") of the control circuit 500. The control signal PBC may include a load signal LOAD, a bit-line set-up signal BLSTP1, a bit-line voltage control signal BLSHF, a bit-line selection signal BLSLT, a shield signal SHLD, a refresh signal RFR, and so on.

The pre-charge circuit 430 may supply a pre-charge voltage Vdd to a sensing node SO. The pre-charge circuit 430 may include a first p-channel metal-oxide semiconductor (PMOS) transistor 431 and a second PMOS transistor 432 which are connected in series between the pre-charge voltage Vdd and the sensing node SO. The first PMOS transistor 431 is turned on or off in response to the load signal LOAD and the second PMOS transistor 432 is turned on or off in response to the bit-line set-up signal BLSTP1.

The switch circuit 435 may include transistors M1, M2, and M3. The transistor M1 may pre-charge the bit-line BL to a determined voltage level in response to the bit-line voltage control signal BLSHF. The transistor M2 may select the bit-line BL in response to the bit-line selection signal BLSLT. The transistor M3 may discharge the bit-line BL in response to the shield signal SHLD.

The sense and latch circuit 440 may detect a voltage level of the sensing node SO. Data may be latched according to the detected voltage level of the sensing node SO. The sense and latch circuit 440 may include a latch 441 and n-channel metal-oxide semiconductor (NMOS) transistors MT1~MT4.

The sense and latch circuit 440 includes inverters INV1 and INV2. The NMOS transistors MT1 and MT3 are coupled between a first node N11 and a ground voltage and the NMOS transistors MT2 and MT4 are coupled between a second node N12 and the ground voltage.

The NMOS transistor MT1 includes a gate receiving a set signal SET, the NMOS transistor MT2 includes a gate receiving a reset signal RST, the NMOS transistor MT3 includes a gate receiving the refresh signal RFR, and the NMO transistor MT4 includes a gate coupled to the sensing node SO. The sense and latch circuit 440 may operate responsive to control signals SET, RST and REF included in the control signal PBC.

Figure 8:
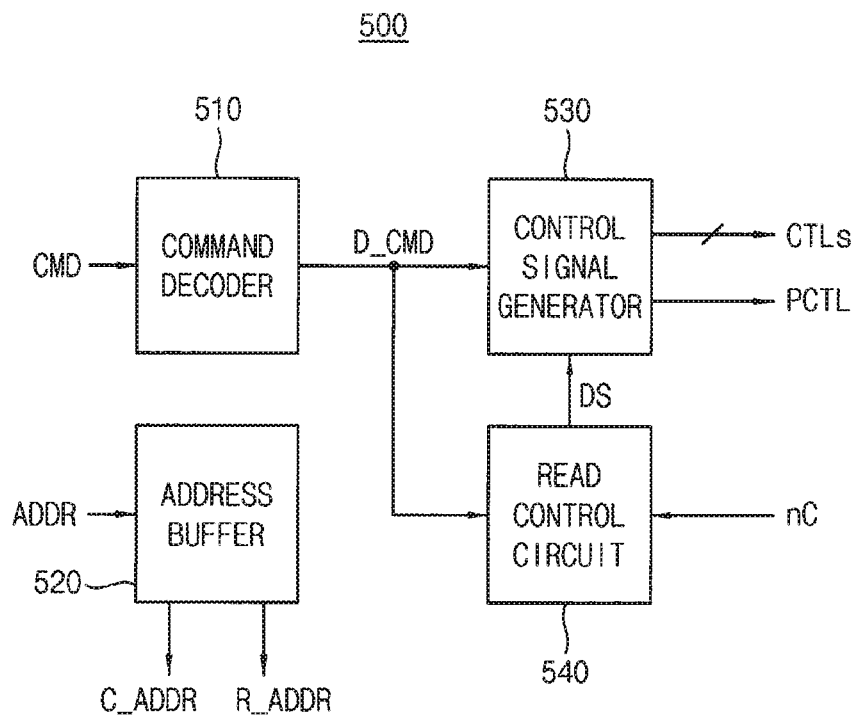
FIG. 8 is a block diagram illustrating the control circuit in the nonvolatile memory device of FIG. 3 according to example embodiments.

FIG. 8 is a block diagram illustrating the control circuit 500 in the nonvolatile memory device 200 of FIG. 3 according to example embodiments.

Referring to FIG. 8, the control circuit 500 includes a command decoder 510, an address buffer 520, a control signal generator 530 and a read control circuit 540. According to some example embodiments, the command decoder 510, control elements of the address buffer 520, the control signal generator 530 and/or the read control circuit 540 may be implemented using processing circuity.

The command decoder 510 may decode the command CMD and provide a decoded command D_CMD to the control signal generator 530. When the decoded command D_CMD is a read command, the command decoder 510 may provide the decoded command D_CMD to the to the read control circuit 540.

The address buffer 520 may receive the address signal ADDR, provide the row address R_ADDR to the address decoder 600 and provide the column address C_ADDR to the data input/output circuit 420.

The read control circuit 540 may receive the number of the memory cells which have a specific threshold voltage range, from the cell counter 490, compare a first number of memory cells in a first region and a second number of memory cells in a second region and provide the control signal generator 530 with a decision signal DS indicating a result of the comparison.

The control signal generator 530 may receive the decoded command D_CMD and the decision signal DS, generate the control signals CTLs based on an operation directed by the decoded command D_CMD and provide the control signals CTLs to the voltage generator 700. In addition, the control signal generator 530 may receive the decision signal DS, generate the page buffer control signal PCTL based on the result indicated by the decision signal DS, and provide the page buffer control signal PCTL to the page buffer circuit 410.

Figure 9:
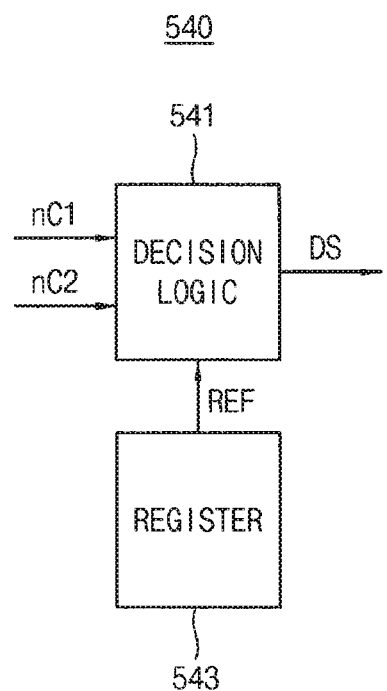
FIG. 9 is block diagram illustrating the read control circuit in the control circuit of FIG. 8 according to example embodiments.

FIG. 9 is block diagram illustrating the read control circuit 540 in the control circuit 500 of FIG. 8 according to example embodiments.

Referring to FIG. 9, the read control circuit 540 includes a decision logic 541 and a register 543. According to some example embodiments, the decision logic 541 may be implemented using processing circuitry.

The decision logic 541 may receive a first number nC1 of memory cells based on a result of the second sensing operation of the first group of page buffers, receive a second number nC2 of memory cells based on a result of the second sensing operation of the second group of page buffers, compare the first number nC1 and the second number nC2, compare a result of comparing the first number nC1 and the second number nC2 with at least one reference value REF and provide the control signal generator 530 with the decision signal DS indicating a result of the comparison with the at least one reference value REF. The register 543 may store the at least one reference value REF.

When a difference between the first number nC1 and the second number nC2 is equal to or smaller than the reference value REF (e.g., a first situation), the decision logic 541 may provide the control signal generator 530 with the decision signal DS indicating the first situation. When the difference between the first number nC1 and the second number nC2 is greater than the reference value REF and the first number nC1 is smaller than the second number nC2 (e.g., a second situation), the decision logic 541 may provide the control signal generator 530 with the decision signal DS indicating the second situation. When the difference between the first number nC1 and the second number nC2 is greater than the reference value REF and the first number nC1 is greater than the second number nC2 (e.g., a third situation), the decision logic 541 may provide the control signal generator 530 with the decision signal DS indicating the third situation. The decision signal DS may include a plurality of bits that represent various situations including the first, second and third situations.

Figure 10:
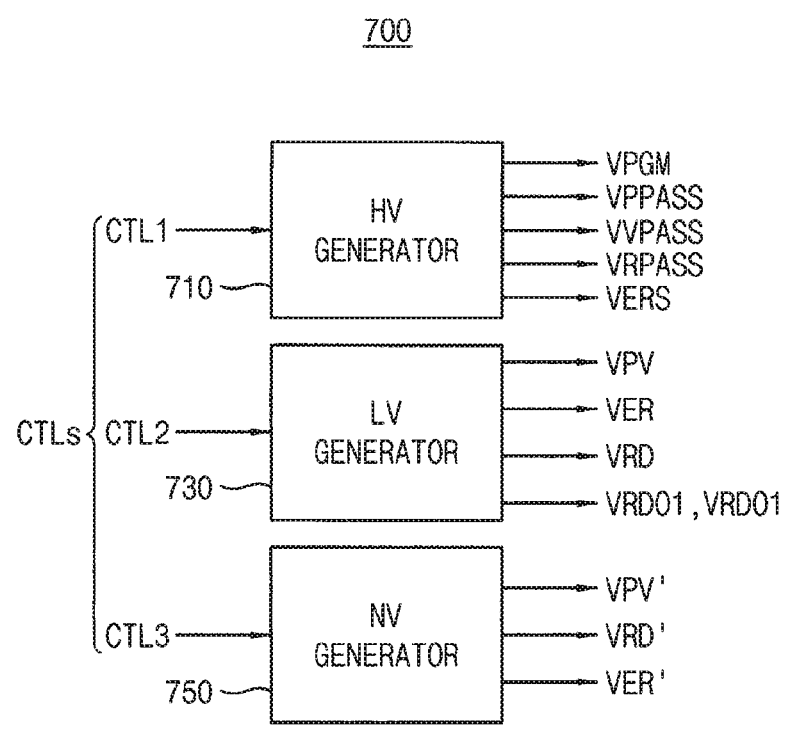
FIG. 10 is a block diagram illustrating the voltage generator in the nonvolatile memory device of FIG. 3 according to example embodiments.

FIG. 10 is a block diagram illustrating the voltage generator 700 in the nonvolatile memory device 200 of FIG. 3 according to example embodiments.

Referring to FIG. 10, the voltage generator 700 includes a high voltage generator 710 and a low voltage generator 730. The voltage generator 700 may further include a negative voltage generator 750. According to some example embodiments, the high voltage generator 710, the low voltage generator 730 and/or the negative voltage generator 750 may be implemented using processing circuitry.

The high voltage generator 710 may generate a program voltage VPGM, a program pass voltage VPPASS, a verification pass voltage VVPASS, a read pass voltage VRPASS and an erase voltage VERS according to operations directed by the command CMD, in response to a first control signal CTL1.

The program voltage VPGM may be applied to the selected word-line, the program pass voltage VPPASS, the verification pass voltage VVPASS and the read pass voltage VRPASS may be applied to the unselected word-lines, and the erase voltage VERS may be applied to the well of the memory block. The first control signal CTL1 may include a plurality of bits which indicate the operations directed by the decoded command D_CMD.

The low voltage generator 730 may generate a program verification voltage VPV, an erase verification voltage VER, a default read voltage VRD and offset read voltages VRDO1 and VRDO2 according to operations directed by the command CMD, in response to a second control signal CTL2. The program verification voltage VPV, the default read voltage VRD, the offset read voltages VRDO1 and VRDO2 and the erase verification voltage VER may be applied to the selected word-line according to operation of the nonvolatile memory device 200. The second control signal CTL2 may include a plurality of bits which indicate the operations directed by the decode command D_CMD.

The negative voltage generator 750 may generate a program verification voltage VPV', a read voltage VRD' and an erase verification voltage VER' which have negative levels according to operations directed by the command CMD, in response to a third control signal CTL3. The third control signal CTL3 may include a plurality of bits which indicate the operations directed by the decoded command D_CMD.

Figure 11:
FIG. 11 illustrates the page buffer circuit in the nonvolatile memory device of FIG. 3 according to example embodiments.

FIG. 11 illustrates the page buffer circuit 410 in the nonvolatile memory device 200 of FIG. 3 according to example embodiments.

Referring to FIG. 11, the page buffer circuit 410 includes a plurality of page buffers 411~42n coupled to the memory cell array 300 through the bit-lines BL1~BL2n. Each of the page buffers 411~42n includes a sensing latch SL, data latches DL1, DL2 and DL3 and a cache latch CL.

The page buffers 411~41n of the page buffers 411~42n may constitute the second group of page buffers and the of the page buffers 41(n+1)~42n of the page buffers 411~42n may constitute the first group of page buffers. Each of the page buffers 411~42n may only use the sensing latch SL when performing the first read operation and the second read operation.

Figure 12:
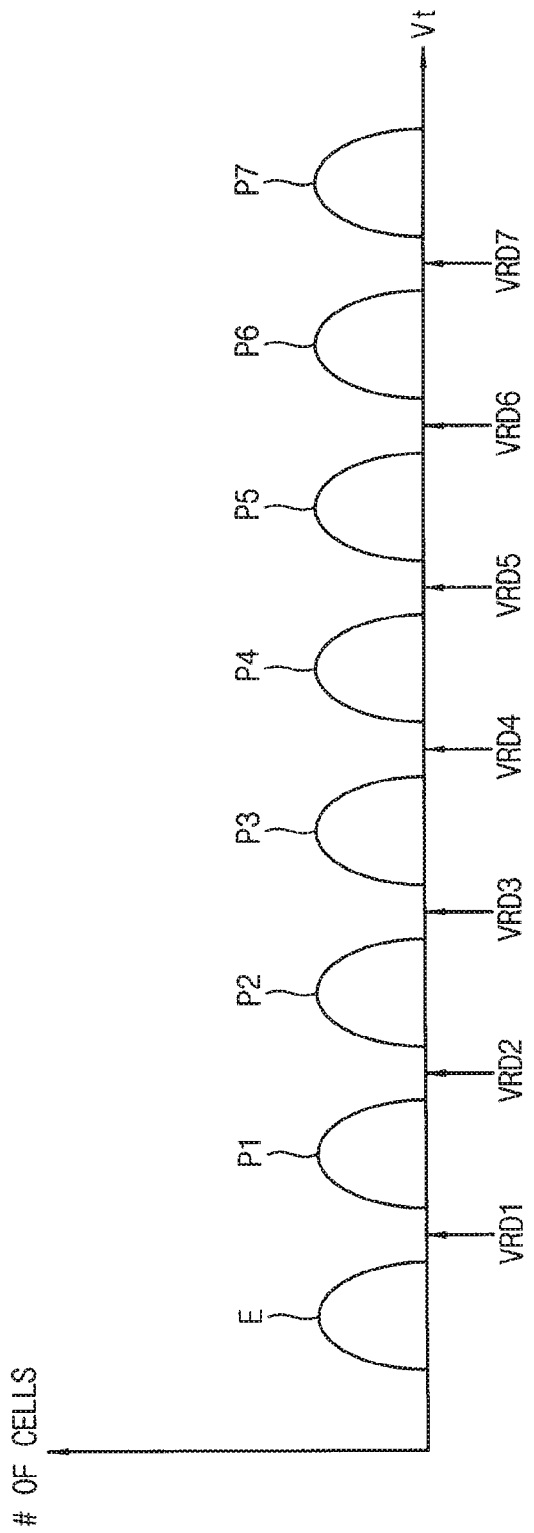
FIGS. 12 and 13 are diagrams for explaining threshold voltage distributions of one page in the memory cell array in FIG. 3.
Figure 13:
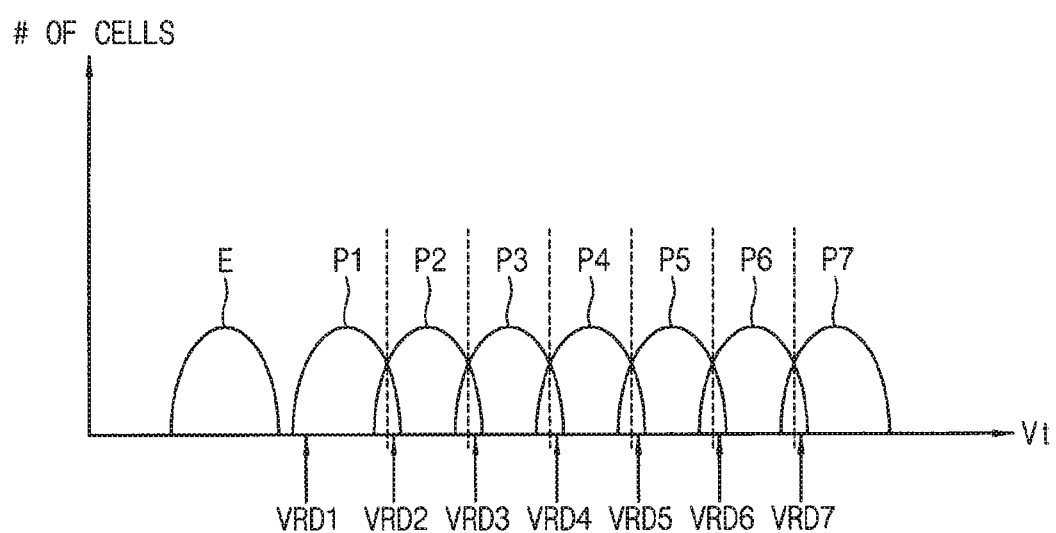

FIGS. 12 and 13 are diagrams for explaining threshold voltage distributions of one page in the memory cell array 300 in FIG. 3.

For the convenience of description, it is assumed that memory cells of a nonvolatile memory device 200 are triple level cells (TLC) each storing three bits and a read voltage set for determining program states of memory cells includes seven read voltages.

Referring to FIG. 12, each memory cell of the nonvolatile memory device 200 has one of an erase state E and first through seventh program states P1 through P7. Under a control of the memory controller 100, the nonvolatile memory device 200 determines program states of memory cells using a default read voltage set VRD1 through VRD7 and outputs read data.

Voltage levels of the default read voltage set VRD1 through VRD7 may be determined depending on cell characteristics. For example, voltage levels of the default read voltage set VRD1 through VRD7 are determined depending on a threshold voltage distribution just after memory cells are programmed.

Referring to FIG. 13, a threshold voltage distribution of memory cells varies due to physical characteristics of memory cells or external factors as time elapses after the memory cells are programmed, as illustrated in FIG. 13. For this reason, the read data, obtained through a read operation using the default read voltage set VRD1 through VRD7, may include an error.

For reducing errors in the read data, the first group of page buffers PBG1 and the second group of page buffers PBG2 may perform the first read operation including a first sensing operation and a second sensing operation simultaneously or contemporaneously during each of develop periods starting from different time points and may perform the second read operation based on a valley searched according to a result of the first read operation internally in the nonvolatile memory device 200.

Figure 14:
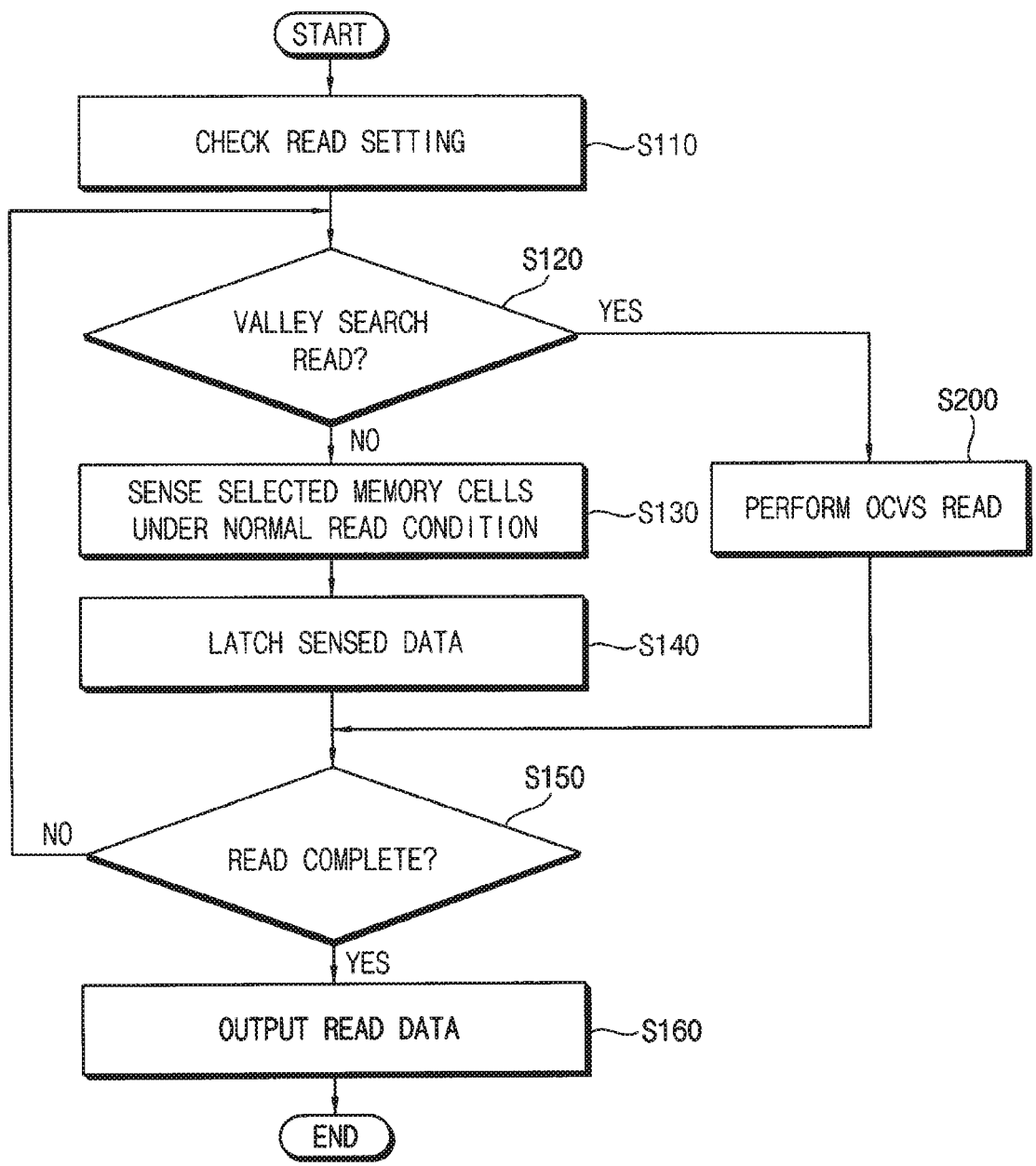
FIG. 14 is a flow chart illustrating a method of operating a nonvolatile memory device according to example embodiments.
Figure 15:
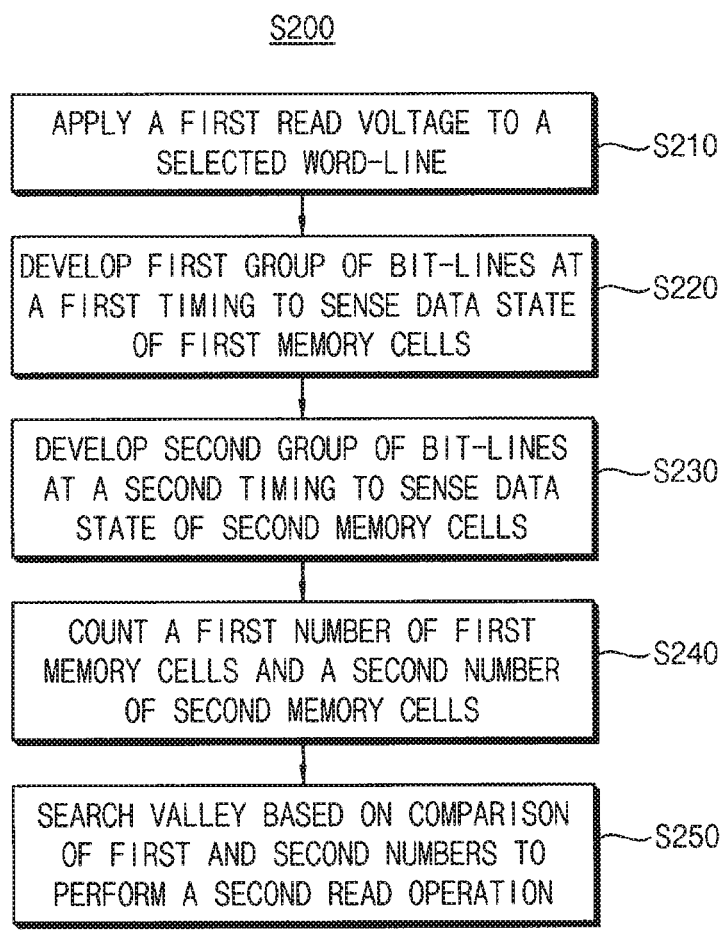
FIG. 15 is a flow chart illustrating an example of on-chip valley search (OCVS) read operation.
Figure 16:
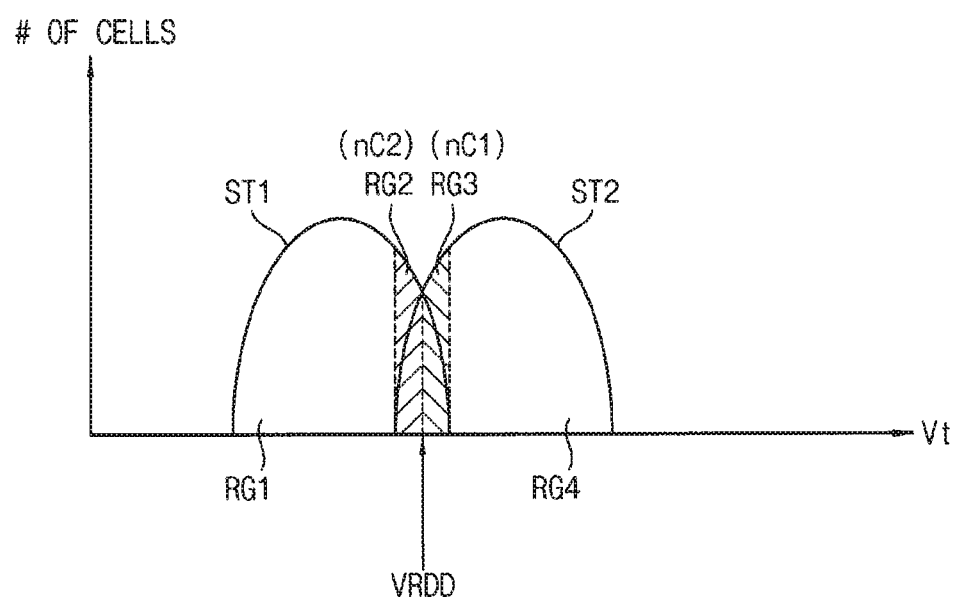
FIG. 16 is a diagram for explaining FIGS. 14 and 15.

FIG. 14 is a flow chart illustrating a method of operating a nonvolatile memory device according to example embodiments, FIG. 15 is a flow chart illustrating an example of on-chip valley search read operation and FIG. 16 is a diagram for explaining FIGS. 14 and 15.

FIG. 16 illustrates adjacent threshold voltage distributions ST1 and ST2, which partially overlap, of the threshold voltage distributions in FIG. 13.

Referring to FIGS. 3 through 16, there is provided a method of operating a nonvolatile memory device 200 including a memory cell array 300 that includes a plurality of pages. Each of the plurality of pages includes a plurality of nonvolatile memory cells, and each of the plurality of nonvolatile memory cells stores a plurality of data bits, and each of the plurality of data bits is distinguished from another data bits by a different respective threshold voltage. In the method, the control circuit 500 determines read setting based on a command CMD and an address ADDR received from the memory controller 100 (S110). The control circuit 500 checks whether the read setting designates an on-chip valley read (S120).

When the read setting designates a normal read (NO in S120), the control circuit 500 controls the voltage generator 700 and the page buffer circuit 410 to provide a read voltage to determine one data state and to perform one sensing operation under a normal read condition (S130). The page buffer circuit 410 latches sensed data (S140).

When the read setting designates an on-chip valley search (OCVS) read (YES in S120), the control circuit 500 controls the voltage generator 700 and the page buffer circuit 410 such that the first group of page buffers PBG1 and the second group of page buffers PBG2 may perform the first read operation including a first sensing operation and a second sensing operation simultaneously or contemporaneously during each of develop periods starting from different time points and may perform the second read operation based on a valley searched according to a result of the first read operation (S200). The control circuit 500 controls the voltage generator 700 and the page buffer circuit 410 such that an on-chip valley search read operation is performed.

The control circuit 500 determines whether the read operation is completed (S150). When the read operation is completed (YES in S50), the nonvolatile memory device 200 transmits (e.g., sends) the sensed data to the memory controller 100 (S160). When the read operation is not completed (NO in S50), the process returns to the operation (S120). In a conventional OCVS read operation, a sensing operation is performed three times during a first read operation, sensed results are stored in different latches and a valley is determined by comparing the results stored in the latches. Accordingly, by performing the first read operation using only two sensing operations the example embodiments enable performance of an OCVS read operation that is faster and consumes fewer resources (e.g., processor, memory and power) than the conventional OCVS read operation.

Referring to FIGS. 14 through 16, for performing the on-chip valley search (OCVS) read operation (S200), the control circuit 500 controls the voltage generator 700 and the address decoder 405 such that the address decoder 405 applies a first offset read voltage (a first read voltage) VRDD to a selected word-line coupled to selected memory cells. The control circuit 500 applies the first bit-line set-up signal BLSTP1 to the first group of page buffers PBG1 to develop the first group of bit-lines from a first time point and to sense a data state of first memory cells in a region RG3 by sequentially performing the first sensing operation and the second sensing operation at least during a first develop period (S220).

The control circuit 500 applies the second bit-line set-up signal BLSTP2 to the second group of page buffers PBG2 to develop the second group of bit-lines from a second time point which is posterior to the first time point and to sense data state of a second memory cells in a region RG2 by sequentially performing the third sensing operation and the fourth sensing operation at least during a second develop period shorter than the first develop period (S230). The first sensing operation and the third sensing operation are performed substantially simultaneously or contemporaneously, and the second sensing operation and the fourth sensing operation are performed substantially simultaneously or contemporaneously. Regions RG3 and RG4 belong to the threshold voltage distribution ST2, and regions RG1 and RG2 belong to the threshold voltage distribution ST1.

The cell counter 490 counts a first number nC1 of on cells in the region RG3, and counts a second number nC2 of on cells in the region RG2, based on the data state of the memory cells in the regions RG3 and RG2, and provides the control circuit 500 with the first number nC1 and the second number nC2 (S250). The control circuit 500 searches a valley based on, for example, a comparison of the first number nC1 and the second number nC2, and performs the second read operation based on the searched valley (S250).

The memory cells in the regions RG3 and RG4 are sensed as off cells by the first sensing operation and the memory cells in the region RG3 are sensed as off cells by the second sensing operation. In addition, the memory cells in the regions RG2, RG3 and RG4 are sensed as off cells by the third sensing operation and the memory cells in the region RG2 are sensed as off cells by the fourth sensing operation.

Figure 17:
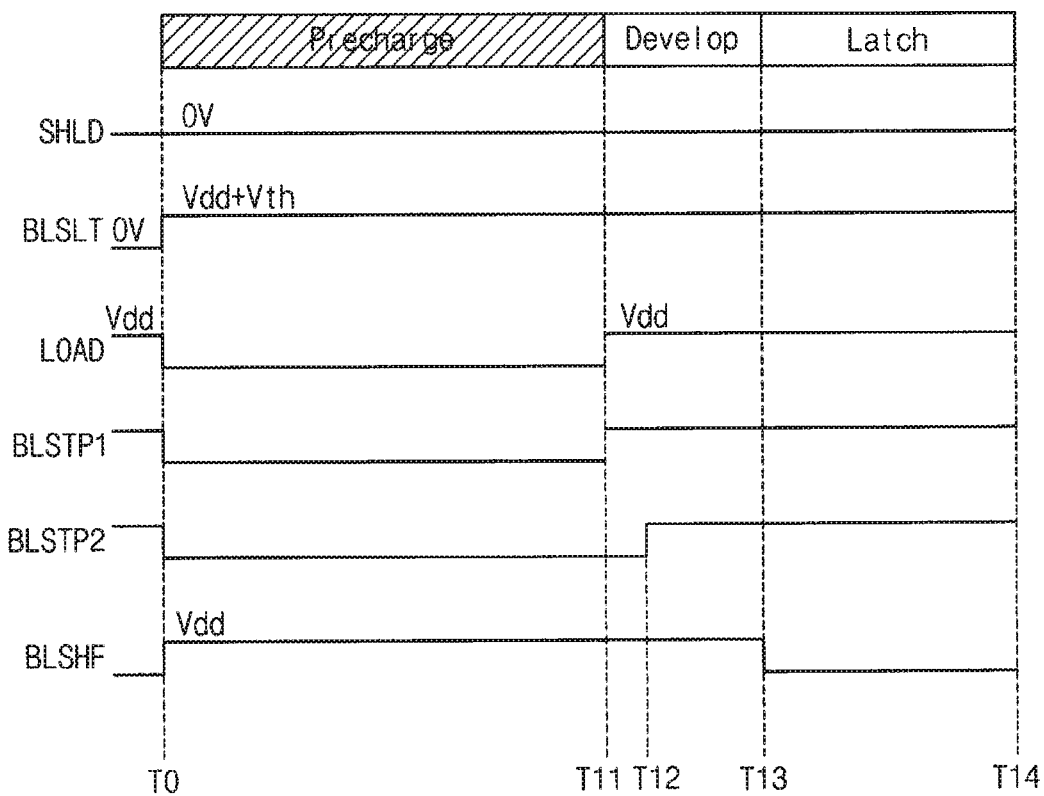
FIG. 17 is a timing diagram for describing an OCVS read operation according to example embodiments.

FIG. 17 is a timing diagram for describing an OCVS read operation according to example embodiments.

Referring to FIG. 17, an OCVS read operation may be performed by latching a sensing node sequentially at a same time point during different develop periods.

From a time point T0 to a time point T11, a pre-charge operation may be performed. The bit-lines BL1 to BL2$n$ and sensing nodes SOs respectively connected to the page buffers 411~42$n$ may be charged to perform the pre-charge operation. For example, when the control signals BLSHF and BLSLT, the load signal LOAD and the bit-line set-up signals BLSTP1 and BLSTP2 are activated, each of the sensing node SO and the bit-lines BL1~BL2$n$ may be pre-charged to a specific level.

At time point T11, when the load signal LOAD and the first bit-line set-up signal BLSTP1 are deactivated with a high level (e.g., the load signal LOAD and the first bit-line set-up signal BLSTP1 are applied with a high level), the PMOS transistors in the pre-charge circuit in the first group of page buffers PBG1 may be turned off, and thus a current supply from a power supply voltage Vdd to the sensing node SO may be interrupted. At time point T12 after time point T1, when the second bit-line set-up signal BLSTP2 are deactivated with a high level, the PMOS transistors in the pre-charge circuit in the second group of page buffers PBG2 may be turned off, and thus a current supply from a power supply voltage Vdd to the sensing node SO may be interrupted.

The level of the sensing node SO in each of the first group of page buffers PBG1 and the level of the sensing node SO in each of the second group of page buffers PBG2 may be changed according to the magnitude of a current flowing into the bit-line BL based on whether a memory cell is turned on or off. When the selected memory cell is an on cell, a current flowing into a bit-line may be relatively great. Accordingly, the level of the sensing node SO may be relatively speedily lowered. On the other hand, when the selected memory cell is an off cell, the level of the sensing node SO may be maintained at a nearly constant level.

However, memory cells of threshold voltages distributed around a valley may be memory cells placed at a boundary between an on cell and an off cell. Accordingly, a distinction between an on cell and an off cell about the memory cells may be changed according to the develop time. That is, even though the develop time slightly decreases, each of the memory cells of threshold voltages distributed around a valley may be determined as an off cell. On the other hand, even though the develop time slightly increases, each of the memory cells of threshold voltages distributed around a valley may be determined as an on cell.

That is, in memory cells having a threshold voltage level similar to a read voltage level to be provided to a word-line, a sensing operation may be performed similarly, or in the same way, as a sensing operation using a decreased read voltage by reducing a develop time. Sensing the sensing nodes SO simultaneously or contemporaneously during different develop periods by differentiate the develop starting time point, may be the same as changing a word-line voltage and sensing a bit-line.

Between time points T13 and T14, a logic level of the sensing node SO is latched in the latch 441.

Figure 18:
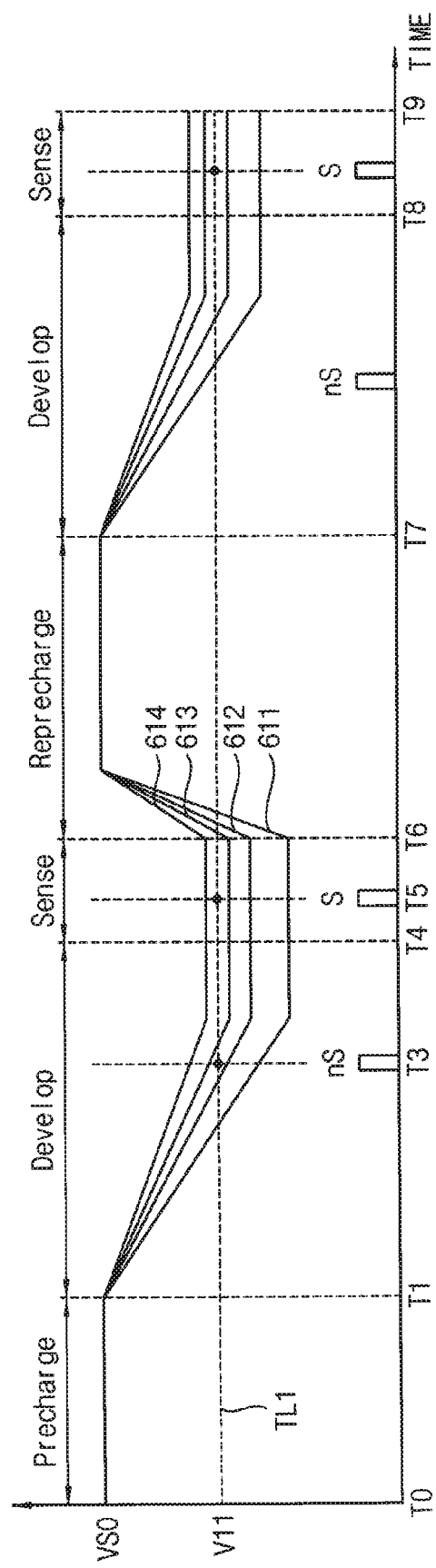
FIGS. 18 and 19 are timing diagrams for describing an OCVS read operation according to example embodiments.
Figure 19:
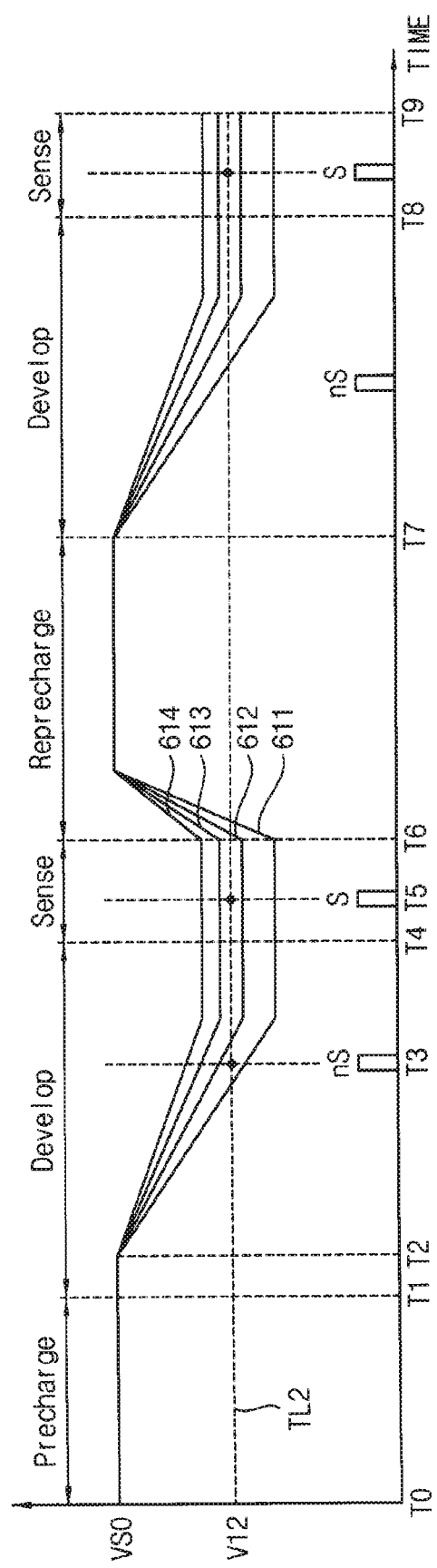

FIGS. 18 and 19 are timing diagrams for describing an OCVS read operation according to example embodiments.

FIG. 18 illustrates an operation of the first group of page buffers and FIG. 19 illustrates an operation of the second group of page buffers.

Referring to FIGS. 18 and 19, the first group of page buffers PBG1 pre-charge the sensing node SO from time point T0 to time point T1, and develop the first group of bit-lines from time point T1 to time point T4. The second group of page buffers PBG2 pre-charge the sensing node SO from time point T0 to time point T1, and develop the second group of bit-lines from time point T2 to time point T4. Time point T2 is posterior to time point T1.

The first group of page buffers PBG1 perform the first sensing operation at time point T3 and perform the second sensing operation at time point T5. The second group of page buffers PBG2 perform the third sensing operation at time point T3 and perform the fourth sensing operation at time point T5. A trip level TL1 of the sensing node SO in each of the first group of page buffers PBG1 corresponds to a first voltage V11 and a trip level TL2 of the sensing node SO in each of the second group of page buffers PBG2 corresponds to a second voltage V12. The first voltage V11 is smaller than the second voltage V12.

The first group of page buffers PBG1 and the second group of page buffers PBG2 repre-charge the sensing node SO (e.g., pre-charge the sensing node SO again) from time point T6 to time point T7, develop the first group of bit-lines and the second group of bit-lines from time point T7 and T8, reset the latch 441 by applying the refresh signal RFR to the transistor MT3 and applying the reset signal RST to the transistor MT2 in the sense and latch circuit 440 between time points T7 and T8, and output data by sensing the sensing node SO between time points T8 and T9.

In FIGS. 18 and 19, VSO denotes a voltage level of the sensing node, and reference numerals 611-614 denote voltages of bit-lines connected to memory cells in the regions RG1~RG4 in FIG. 16, respectively. In FIGS. 18 and 19, operation between time points T0 and T6 may correspond to the first read operation and operation between time points T6 and T9 may correspond to the second read operation.

Figure 20:
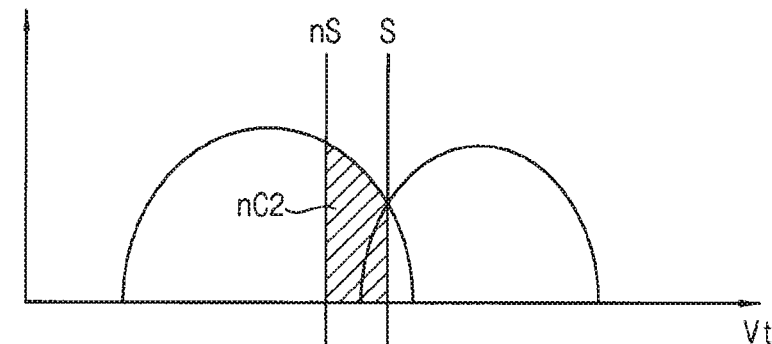
FIG. 20 illustrates states of a latch in each of the second group of page buffers and FIG. 21 illustrates states of a latch in each of the first group of page buffers.
Figure 21:
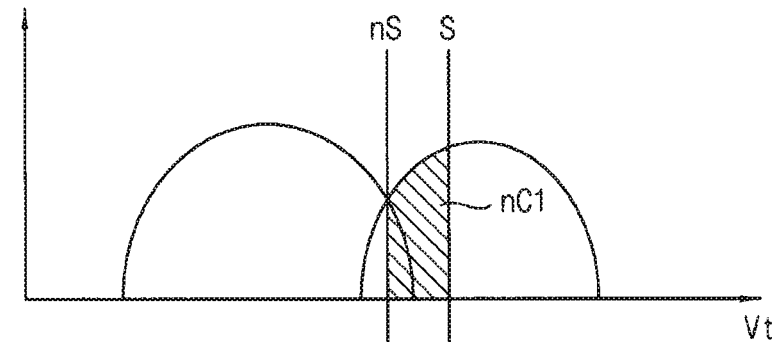

FIG. 20 illustrates states of a latch in each of the second group of page buffers and FIG. 21 illustrates states of a latch in each of the first group of page buffers.

In FIGS. 20 and 21, the latch in each of the page buffers is initially set to a high level.

Referring to FIG. 20, when the second group of page buffers PBG2 perform the third sensing operation nS_Sensing by activating the reset signal RST, a latch coupled to each of the on cells is maintained with a high level, and a latch coupled to each of the off cells is flipped to a low level. When the second group of page buffers PBG2 perform the fourth sensing operation S_Sensing by activating the set signal SET, a latch coupled to each of the on cells in the region RG2 is maintained with a low level, and the latch coupled to each of the off cells is flipped to a high level. Therefore, the cell counter 490 may generate the second number nC2 by counting the cells whose latch have a low level based on a result of the fourth sensing operation.

Referring to FIG. 21, when the first group of page buffers PBG1 perform the first sensing operation nS_Sensing by activating the reset signal RST, a latch coupled to each of the on cells is maintained with a high level, and a latch coupled to each of the off cells is flipped to a low level. When the first group of page buffers PBG1 perform the second sensing operation S_Sensing by activating the set signal SET, a latch coupled to each of the on cells in the region RG3 is maintained with a low level, and the latch coupled to each of the off cells is flipped to a high level. Therefore, the cell counter 490 may generate the first number nC1 by counting the cells whose latch have a low level based on a result of the second sensing operation.

Figure 22A:
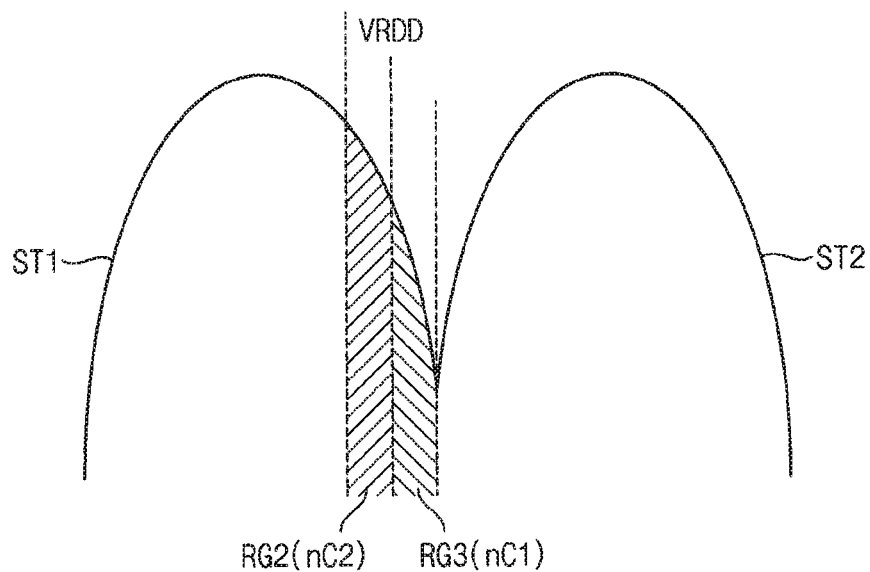
FIGS. 22A to 22C are diagrams illustrating results of the first read operation in the OCVS read operation.
Figure 22B:
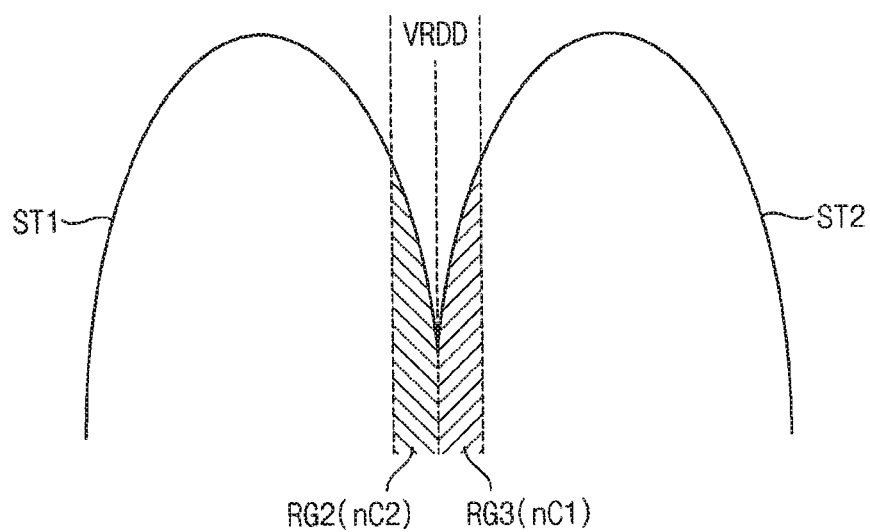
Figure 22C:
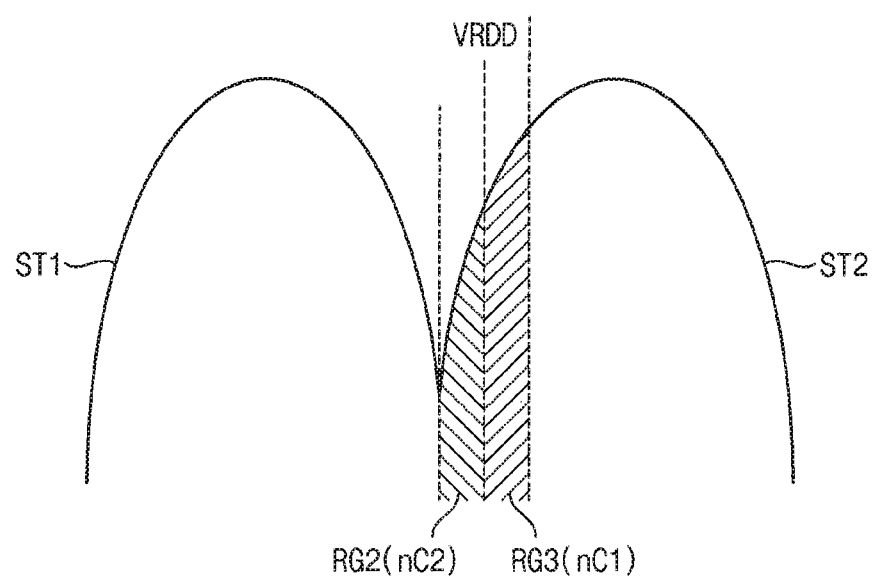

FIGS. 22A to 22C are diagrams illustrating results of the first read operation in the OCVS read operation.

Referring to FIG. 22A, according to a result of the second and fourth sensing operations, a difference between the first number nC1 and the second number nC2 is greater than the reference value REF and the first number nC1 is smaller than the second number nC2, which corresponds to the second situation. The second situation represents that the valley is smaller than a threshold voltage corresponding to the default read voltage VRDD, the control circuit 500 applies a second read voltage greater than the default read voltage VRDD to the selected word-line and the page buffer circuit 410 performs the second read operation.

Referring to FIG. 22B, according to a result of the second and fourth sensing operations, the difference between the first number nC1 and the second number nC2 is equal to or smaller than the reference value REF, which corresponds to the first situation. The first situation represents that the valley is around at the threshold voltage corresponding to the default read voltage VRDD, the control circuit 500 applies the default read voltage VRDD to the selected word-line and the page buffer circuit 410 performs the second read operation.

Referring to FIG. 22C, according to a result of the second and fourth sensing operations, the difference between the first number nC1 and the second number nC2 is greater than the reference value REF and the first number nC1 is greater than the second number nC2, which corresponds to the third situation. The third situation represents that the valley is greater than the threshold voltage corresponding to the default read voltage VRDD, the control circuit 500 applies a second read voltage smaller than the default read voltage VRDD to the selected word-line and the page buffer circuit 410 performs the second read operation.

FIG. 23 is a diagram illustrating a read operation on a memory cell.

Referring to FIG. 23, a read operation may be disclosed by a page about a triple level cell (TLC) which stores 3 bits of data per cell.

To read a least significant bit (LSB) page, a read voltage VRD1 may be provided to a word line of selected memory cells. Moreover, whether the selected memory cells are turned on or off based on the read voltage VRD1 may be sensed and information about whether the selected memory cells are turned on or off may be stored in one of a plurality of latches. Logical high may be latched according to the sensed result of a memory cell (e.g., on cell) having a threshold voltage lower than the read voltage VRD1. Logical low may be latched according to the sensed result of a memory cell (e.g., off cell) having the threshold voltage equal to or higher than the read voltage VRD1.

Next, a read voltage VRD5 may be provided to a word line of selected memory cells. Moreover, a memory cell sensed as an on cell based on the read voltage VRD5 may maintain logical low which is previously latched. Moreover, a memory cell sensed as an off cell based on the read voltage VRD5 may maintain logical high obtained by toggling logical low which is previously latched. After this processing is completed, a read result of the LSB page may be outputted.

To read a central significant bit (CSB) page, a read voltage VRD2 may be provided to a word line of selected memory cells. Moreover, logical high may be latched in a page buffer corresponding to memory cells each of which is sensed as an on cell based on the read voltage VRD2, and logical low may be latched in a page buffer corresponding to memory cells each of which is sensed as an off cell based on the read voltage VRD2. Moreover, a page buffer corresponding to memory cells each of which is sensed as an on cell based on a read voltage VRD4 may maintain a logical value which is previously sensed, and logical high may be latched in a page buffer corresponding to memory cells each of which is sensed as an off cell based on the read voltage VRD4. Finally, a page buffer corresponding to memory cells each of which is sensed as an on cell based on a read voltage VRD6 may maintain a logical value which is previously sensed, and logical low may be latched in a page buffer corresponding to memory cells each of which is sensed as an off cell based on the read voltage VRD6.

To read a most significant bit (MSB) page, a read voltage VRD3 may be provided to a word line of selected memory cells. Moreover, whether the selected memory cell are turned on or off based on the read voltage VRD3 may be sensed and information about whether the selected memory cell are turned on or off may be stored in one of a plurality of latches. Logical high may be latched in a page buffer corresponding to memory cells each of which is sensed as an on cell based on the read voltage VRD3, logical low may be latched in a page buffer corresponding to memory cells each of which is sensed as an off cell based on the read voltage VRD3.

Next, a read voltage VRD7 may be provided to a word line of selected memory cells. Moreover, a logical value of a page buffer corresponding to memory cells each of which is sensed as an on cell based on the read voltage VRD7 may be maintained with a logical value which is previously sensed. A page buffer corresponding to memory cells each of which is sensed as an off cell based on the read voltage VRD7 may maintain logical high obtained by toggling logical low which is previously latched. After this processing is completed, a read result of the MSB page may be outputted.

Above, a read operation of a triple level cell (TLC) is described as an example. During the read operation, a read fail may occur due to the deterioration of a memory cell. The nonvolatile memory device 200 according to example embodiments of inventive concepts may perform the OCVS read operation for providing a high reliability based on an external request or an internal determination and may provide the result to an external device.

Figure 24:
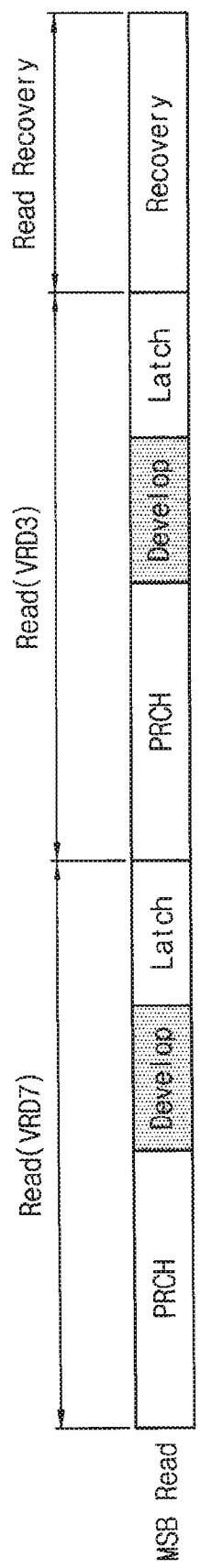
FIG. 24 is a timing diagram for describing application of an OCVS read operation to most significant bit (MSB) page according to example embodiments.

FIG. 24 is a timing diagram for describing application of an OCVS read operation to MSB page according to example embodiments.

Referring to FIG. 24, to read an MSB page, a read operation of the OCVS mode based on the read voltage VRD7 may be performed. Next, a normal read operation may be performed based on the read voltage VRD3, a cell may be counted and a latch set may be selected during a pre-charge period of the normal read operation. Read recovery operation may be performed after the read operation based on the read voltage VRD3.

Figure 25:
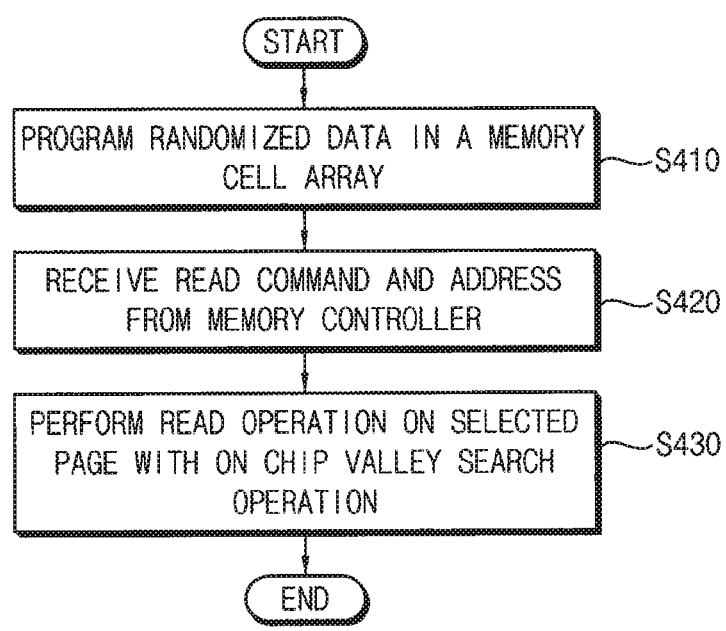
FIG. 25 is a flow chart illustrating a method of operating a nonvolatile memory device according to example embodiments.

FIG. 25 is a flow chart illustrating a method of operating a nonvolatile memory device according to example embodiments.

Referring to FIG. 25, the nonvolatile memory device 200 programs randomized data in a first page of the memory cell array 300 such that each of a plurality of memory cells stores a plurality of data bits as one of a plurality of threshold voltage distributions corresponding to a plurality of logic states, in response to a program command (S410).

The nonvolatile memory device 200 receives a read command and an address (S420). When the read command designates the OCVS read mode on the first page, the page buffer circuit 410 searches for a valley by performing the OCVS read operation, performs the second read operation based on the searched valley and outputs data (S430).

Figure 26:
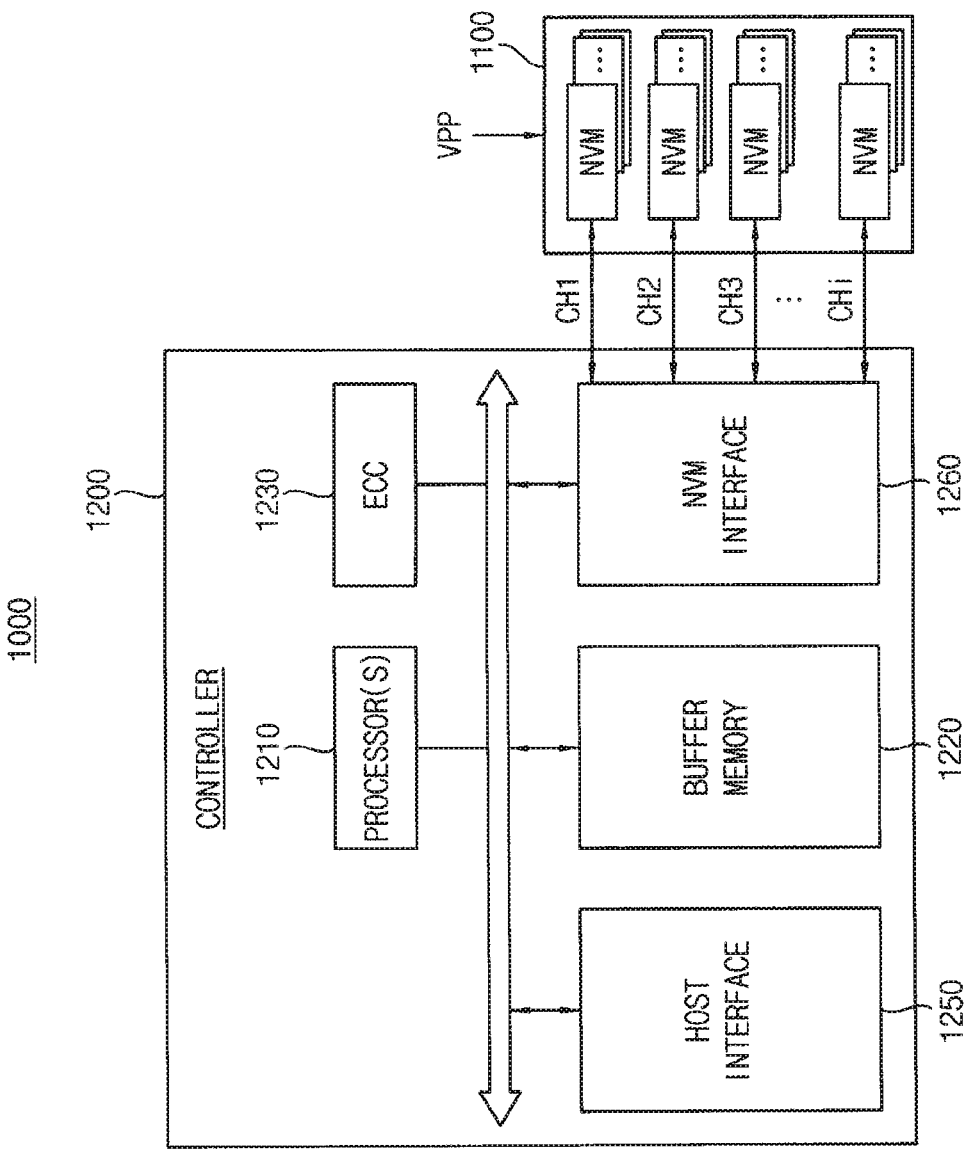
FIG. 26 is a block diagram illustrating a solid state disk or solid state drive (SSD) according to example embodiments.

FIG. 26 is a block diagram illustrating a solid state disk or solid state drive (SSD) according to example embodiments.

Referring to FIG. 26, an SSD 1000 includes multiple nonvolatile memory devices 1100 and an SSD controller 1200.

The nonvolatile memory devices 1100 may be optionally supplied with an external high voltage (or a second power supply voltage) VPP. Each of the nonvolatile memory devices 1100 may include the nonvolatile memory device 200 of FIG. 3. Therefore, each of the nonvolatile memory devices 1100 may search for a valley by performing the OCVS read operation, and perform the second read operation based on the searched valley. Accordingly, each of the nonvolatile memory devices 1100 may reduce errors in read data.

The SSD controller 1200 may be connected to the nonvolatile memory devices 1100 through multiple channels CH1 to CHi. The SSD controller 1200 includes one or more processors 1210, a buffer memory 1220, an ECC block 1230, a host interface 1250, and a nonvolatile memory interface 1260. According to some example embodiments, the ECC block 1230, the host interface 1250 and/or the nonvolatile memory interface 1260 may be implemented using processing circuity.

The buffer memory 1220 may store data used to drive the SSD controller 1200. The buffer memory 1220 may include multiple memory lines each storing data or a command. The ECC block 1230 may calculate error correction code values of data to be programmed at a writing operation and correct an error of read data using an error correction code value at a read operation. In a data recovery operation, the ECC block 1230 may correct an error of data recovered from the nonvolatile memory devices 1100.

According to example embodiments, during an on-chip valley search operation, the first group of page buffers and the second group of page buffers may sequentially sense the sensing nodes two times during develop periods which have different develop starting time points, search for a valley by counting cells based on a result of the sensing, and perform the second read operation based on the searched valley. Accordingly, the nonvolatile memory devices 1100 may reduce errors in read data and may enhance performance per on-chip (e.g., per nonvolatile memory device 1100).

A nonvolatile memory device or a storage device according to example embodiments may be packaged using various package types or package configurations.

The present disclosure may be applied to various electronic devices including a nonvolatile memory device. For example, the present disclosure may be applied to systems such as a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The various operations of methods described above may be performed by any suitable device capable of performing the operations, such as processing circuitry.

The software may comprise an ordered listing of executable instructions for implementing logical functions, and can be embodied in any "processor-readable medium" for use by or in connection with an instruction execution system, apparatus, or device, such as a single or multiple-core processor or processor-containing system.

The blocks or operations of a method or algorithm and functions described in connection with the example embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A nonvolatile memory device comprising:
a memory cell array including a plurality of pages, each of the plurality of pages including a plurality of memory cells, each of the plurality of memory cells storing a plurality of data bits, each of the plurality of data bits being selectable by a different threshold voltage;
a page buffer circuit coupled to the memory cell array through a plurality of bit-lines, the page buffer circuit including a plurality of page buffers configured to
sense data from selected memory cells among the plurality of memory cells through the plurality of bit-lines, and
perform a first read operation and a second read operation, each including two sequential sensing operations to determine one data state, and each of the plurality of page buffers including a latch, among a plurality of latches, the latch configured to sequentially store results of the two sequential sensing operations; and
a control circuit configured to control the plurality of page buffers to store a result of the first read operation,
reset the plurality of latches after completion of the first read operation, and
control the plurality of page buffers to perform the second read operation based on a valley determined based on the result of the first read operation.

2. The nonvolatile memory device of claim 1, wherein the page buffer circuit includes a first group of page buffers coupled to a first group of bit-lines among the plurality of bit-lines and a second group of page buffers coupled to a second group of bit-lines among the plurality of bit-lines,
the first group of page buffers is configured to perform the first read operation with respect to the selected memory cells during a first develop period, and
the second group of page buffers is configured to perform the first read operation with respect to the selected memory cells during a second develop period different from the first develop period.

3. The nonvolatile memory device of claim 2, wherein
the control circuit is configured to cause a first read voltage to be applied to one or more word-lines coupled to the selected memory cells during performance of the first read operation,
the first group of page buffers is configured to sequentially perform a first sensing operation and a second sensing operation on the first group of bit-lines, and
the second group of page buffers is configured to sequentially perform a third sensing operation and a fourth sensing operation on the second group of bit-lines.

4. The nonvolatile memory device of claim 3, wherein
the first group of page buffers is configured to perform the first read operation on the selected memory cells during the first develop period which starts at a first time point, and
the second group of page buffers is configured to perform the first read operation on the selected memory cells during the second develop period which starts at a second time point posterior to the first time point.

5. The nonvolatile memory device of claim 3, wherein the control circuit is configured to control the first group of page buffers and the second group of page buffers such that the first group of page buffers and the second group of page buffers respectively perform the first sensing operation and the third sensing operation contemporaneously, and the first group of page buffers and the second group of page buffers respectively perform the second sensing operation and the fourth sensing operation contemporaneously.

6. The nonvolatile memory device of claim 5, wherein the control circuit is configured to
count a first number of on cells stored in each of a first group of latches among the plurality of latches included in the first group of page buffers based on a result of the second sensing operation,
count a second number of on cells stored in each of a second group of latches among the plurality of latches included in the second group of page buffers based on a result of the fourth sensing operation, and
determine a position of the valley based on the first number of on cells and the second number of on cells.

7. The nonvolatile memory device of claim 6, wherein the control circuit is configured to control the plurality of page buffers to perform the second read operation based on the first read voltage if a difference between the first number of on cells and the second number of on cells is equal to or smaller than a reference value.

8. The nonvolatile memory device of claim 6, wherein the control circuit is configured to control the plurality of page buffers to perform the second read operation based on a second read voltage greater than the first read voltage if (i) a difference between the first number of on cells and the second number of on cells is greater than a reference value, and (ii) the first number of on cells is smaller than the second number of on cells.

9. The nonvolatile memory device of claim 6, wherein the control circuit is configured to control the plurality of page buffers to perform the second read operation based on a third read voltage smaller than the first read voltage if (i) a difference between the first number of on cells and the second number of on cells is greater than a reference value, and (ii) the first number of on cells is greater than the second number of on cells.

10. The nonvolatile memory device of claim 1, wherein each of the plurality of page buffers includes:
a pre-charge circuit including a first p-channel metal-oxide semiconductor (PMOS) transistor and a second PMOS transistor connected in series between a pre-charge voltage source and a sensing node;
a switch circuit coupled between a respective bit-line among the plurality of bit-lines and the sensing node; and
a sense and latch circuit coupled between the sensing node and a ground voltage source, the sense and latch circuit including,
a respective latch among the plurality of latches,
a first n-channel metal-oxide semiconductor (NMOS) transistor,
a second NMOS transistor connected in series with the first NMOS transistor between a first node of the respective latch and the ground voltage source,
a third NMOS transistor, and
a fourth NMOS transistor connected in series with the third NMOS transistor between a second node of the respective latch and the ground voltage source, a gate of the fourth NMOS transistor being connected to the sensing node,
wherein the control circuit is configured to
apply a load signal to a gate of the first PMOS transistor,
apply a bit-line set-up signal to a gate of the second PMOS transistor,
apply a reset signal to the third NMOS transistor such that the sense and latch circuit performs a first sensing operation of the first read operation, and
apply a set signal to the first NMOS transistor such that the sense and latch circuit performs a second sensing operation of the first read operation.

11. The nonvolatile memory device of claim 10, wherein after the plurality of bit-lines are pre-charged, the control circuit is configured to:
apply a first bit-line set-up signal with a logic high level to the second PMOS transistor of each of a first group of pages buffers among the plurality of page buffers at a first time point such that each of the first group of page buffers sequentially performs the first sensing operation and the second sensing operation on the sensing node; and
apply a second bit-line set-up signal with a logic high level to the second PMOS transistor of each of a second group of pages buffers among the plurality of page buffers at a second time point posterior to the first time point such that each of the second group of page buffers sequentially performs a third sensing operation and a fourth sensing operation on the sensing node.

12. The nonvolatile memory device of claim 11, wherein the control circuit is configured to control the first group of page buffers and the second group of page buffers such that the first group of page buffers and the second group of page buffers respectively perform the first sensing operation and the third sensing operation contemporaneously, and the first group of page buffers and the second group of page buffers respectively perform the second sensing operation and the fourth sensing operation contemporaneously.

13. The nonvolatile memory device of claim 11, wherein the control circuit is configured to:
count a first number of on cells stored in each of a first group of latches among the plurality of latches included in the first group of page buffers based on a result of the first sensing operation and the second sensing operation,
count a second number of on cells stored in each of a second group of latches among the plurality of latches included in the second group of page buffers based on a result of the third sensing operation and the fourth sensing operation,
determine the valley based on the first number of on cells and the second number of on cells, and
reset one or more values stored in the plurality of latches by applying a refresh signal to a gate of the third NMOS transistor after the determination of the valley.

14. The nonvolatile memory device of claim 1, wherein the memory cell array includes:
first memory cells coupled to a first word-line, the first memory cells corresponding to the selected memory cells; and
second memory cells coupled to a second word-line, the second memory cells being stacked on the first memory cells.

15. A method of operating a nonvolatile memory device including a memory cell array, the memory cell array including a plurality of pages, each of the plurality of pages including a plurality of memory cells, each of the plurality of memory cells storing a plurality of data bits, each of the plurality of data bits being selectable by a different threshold voltage, the method comprising:

performing a first read operation including two sensing operations through a plurality of bit-lines to determine one data state from one or more selected memory cells among the plurality of memory cells; and performing a second read operation to determine one data state based on a valley determined based on a result of the first read operation, wherein results of the two sensing operations are sequentially stored in a plurality of latches, each latch among the plurality of latches being included in a corresponding page buffer among a plurality of page buffers, the plurality of page buffers being coupled to the plurality of bit-liners, and the plurality of latched being reset after completion of the first read operations.

16. The method of claim 15, wherein the plurality of page buffers includes a first group of page buffers coupled to a first group of bit-lines among the plurality of bit-lines and a second group of page buffers coupled to a second group of bit-lines among the plurality of bit-lines, and the performing the first read operation includes, sequentially performing, in each of the first group of page buffers, a first sensing operation and a second sensing operation on a sensing node coupled to the first group of bit-lines during a first develop period, the first develop period starting from a first time period, and sequentially performing, in each of the second group of page buffers, a third sensing operation and a fourth sensing operation on a sensing node coupled to the second group of bit-lines during a second develop period, the second develop period starting from a second time period posterior to the first time period.

17. The method of claim 16, wherein the first sensing operation and the third sensing operation are performed contemporaneously and the second sensing operation and the fourth sensing operation are performed contemporaneously.

18. The method of claim 16, further comprising:

counting a first number of on cells stored in each of a first group of latches among the plurality of latches included in the first group of page buffers based on a result of the second sensing operation;

counting a second number of on cells stored in each of a second group of latches among the plurality of latches included in the second group of page buffers based on a result of the fourth sensing operation; and determining a position of the valley based on the first number of on cells and the second number of on cells.

19. A method of operating a nonvolatile memory device including a memory cell array, the memory cell array including a plurality of pages, each of the plurality of pages including a plurality of nonvolatile memory cells, each of the plurality of nonvolatile memory cells storing a plurality of data bits, each of the plurality of data bits being selectable by a plurality of different threshold voltage, the method comprising:

determining, in a control circuit of the nonvolatile memory device, a read setting of the nonvolatile memory device based on a command and an address, the command and the address being received from a memory controller configured to control the nonvolatile memory device;

sensing one or more data bits stored in one or more selected memory cells among the plurality of nonvolatile memory cells based on a normal read condition in response to determining the read setting designates a normal read operation; and performing an on-chip valley search read operation on the one or more selected memory cells in response to determining the read setting designates a valley search read operation, wherein the on-chip valley search read operation is performed by determining a valley of the plurality of different threshold voltages, and sensing the one or more data bits stored in the one or more selected memory cells based on the valley.

20. The method of claim 19, wherein the performing the on-chip valley search read operation includes:

performing a first read operation including two sensing operations through a plurality of bit-lines to determine one data state from the one or more selected memory cells; and performing a second read operation to determine one data state based on the valley determined based on a result of the first read operation, wherein results of the two sensing operations are sequentially stored in a plurality of latches, each latch among the plurality of latches being included in a corresponding page buffer among a plurality of page buffers, the plurality of page buffers being coupled to the plurality of bit-lines.

* * * * *